US008330234B2

(12) United States Patent
Hase

(10) Patent No.: US 8,330,234 B2
(45) Date of Patent: Dec. 11, 2012

(54) SEMICONDUCTOR DEVICE AND MANUFACTURING PROCESS THEREFOR

(75) Inventor: Takashi Hase, Tokyo (JP)

(73) Assignee: NEC Corporation, Tokyo (JP)

( * ) Notice: Subject to any disclaimer, the term of this patent is extended or adjusted under 35 U.S.C. 154(b) by 1213 days.

(21) Appl. No.: 12/094,755

(22) PCT Filed: Nov. 21, 2006

(86) PCT No.: PCT/JP2006/323190
§ 371 (c)(1),
(2), (4) Date: May 22, 2008

(87) PCT Pub. No.: WO2007/060938
PCT Pub. Date: May 31, 2007

(65) Prior Publication Data
US 2009/0267158 A1    Oct. 29, 2009

(30) Foreign Application Priority Data

Nov. 22, 2005   (JP) .................................. 2005-337227

(51) Int. Cl.
*H01L 29/78*     (2006.01)
*H01L 21/70*     (2006.01)
*H01L 23/48*     (2006.01)
*H01L 23/52*     (2006.01)
*H01L 29/40*     (2006.01)
*H01L 21/8238*   (2006.01)
*H01L 21/336*    (2006.01)
*H01L 21/3205*   (2006.01)
*H01L 21/4763*   (2006.01)
*H01L 21/44*     (2006.01)

(52) U.S. Cl. ........ 257/412; 257/369; 257/413; 257/754; 257/755; 257/757; 257/768; 257/769; 257/770; 257/E29.16; 257/E29.161; 257/E21.199; 257/E21.2; 257/E21.203; 257/E21.204; 257/E21.622; 257/E21.623; 257/E21.636; 257/E21.637; 438/199; 438/283; 438/587; 438/655; 438/656; 438/682; 438/683; 438/685

(58) Field of Classification Search ........................ None
See application file for complete search history.

(56) References Cited

U.S. PATENT DOCUMENTS 4,786,611 A * 11/1988 Pfiester ........................ 438/233
(Continued)

FOREIGN PATENT DOCUMENTS

JP          06-104259       *   4/1994
(Continued)

OTHER PUBLICATIONS

Kittl et al. CMOS Integration of Dual Work Function Phase-Controlled Ni Fully Silicided Gates (NMOS:NiSi, PMOS:Ni2Si, and Ni31Si12) on HfSiON. IEEE Electron Device Letters, vol. 27, No. 12, Dec. 2006. pp. 966-968.* Aoyama et al. Proposal of new HfSiON CMOS fabrication process (HAMDAMA) for low standby power device. Dec. 13-15, 2004. IEDM Technical Digest. Electron Devices Meeting, 2004. pp. 95-98.*

(Continued)

*Primary Examiner* — Hoang-Quan Ho
(74) *Attorney, Agent, or Firm* — Young & Thompson

(57) ABSTRACT

In a semiconductor device, a gate electrode having a uniform composition prevents deviation in a work function. Controlling a $V_{th}$ provides excellent operation properties. The semiconductor device includes an NMOS transistor and a PMOS transistor with a common line electrode. The line electrode includes electrode sections (A) and (B) and a diffusion barrier region formed over an isolation region so that (A) and (B) are kept out of contact. The diffusion barrier region meets at least one of: (1) The diffusion coefficient in the above diffusion barrier region of the constituent element of the above electrode section (A) is lower than the interdiffusion coefficient of the constituent element between electrode section (A) materials; and (2) The diffusion coefficient in the above diffusion barrier region of the constituent element of the above electrode section (B) is lower than the interdiffusion coefficient of the constituent element between electrode section (B) materials.

19 Claims, 21 Drawing Sheets

U.S. PATENT DOCUMENTS

| | | | | |
|---|---|---|---|---|
| 5,550,079 | A | * | 8/1996 | Lin .................................. 438/587 |
| 5,633,523 | A | * | 5/1997 | Kato ............................. 257/369 |
| 5,705,845 | A | * | 1/1998 | Fujii .............................. 257/412 |
| 6,127,707 | A | * | 10/2000 | Chong et al. ................... 257/384 |
| 7,429,770 | B2 | | 9/2008 | Kadoshima et al. |
| 2004/0065930 | A1 | * | 4/2004 | Lin et al. ........................ 257/412 |
| 2004/0227162 | A1 | * | 11/2004 | Ashida ........................... 257/204 |
| 2005/0167762 | A1 | | 8/2005 | Kadoshima et al. |
| 2006/0258156 | A1 | * | 11/2006 | Kittl .............................. 438/682 |
| 2007/0093015 | A1 | * | 4/2007 | Kudo et al. .................... 438/199 |

FOREIGN PATENT DOCUMENTS

| | | | |
|---|---|---|---|
| JP | 06-249660 | | 4/1994 |
| JP | 09-082810 | * | 3/1997 |
| JP | 2004-165346 | | 6/2004 |
| JP | 2004-221226 | | 8/2004 |
| JP | 2005-167251 | | 6/2005 |
| JP | 2005-217275 | | 8/2005 |
| JP | 2007-123431 | | 5/2007 |
| WO | 2007/026677 | | 3/2007 |

OTHER PUBLICATIONS

Takahashi et al. 'Dual workfunction Ni-Silicide/HfSiON gate stacks by phase-controlled full-silicidation (PC-FUSI)technique for 45nm-node LSTP and LOP devices' : Electron Devices Meeting, 2004. IEDM Technilcal Digest. IEEE International: Dec. 13, 2004, p. 91-94; full text; Figs. 1 to 11.

Aime et al. 'Work function tuning through dopant scanning and related effects in Ni fully silicided gate for sub-45nm nodes CMOS' ; Electron Devices Meeting, 2004. IEDM Technical Digest. IEEE International ; Dec. 13, 2004, p. 87-90; full text; Figs. 1 to 20.

Zhong et al. 'Properties of Ru-Ta Alloys as Gate Electrodes For NMOS and PMOS Silcon Devces' : Electron Devices Meeting, 2001. IEDM Technical Digest. International: Dec. 2, 2001, p. 467-470; full text; Figs. 1 to 18.

International Search Report (ISR).

Japanese Official Action—2007-546443—Jul. 3, 2012.

D. Aime et al—Work function tuning through dopant scanning and related effects in Ni fully silicided gate for sub-45nm nodes CMOS, Electron Devices Meeting, 2004, IEDM Technical Digest, IEEE International, Dec. 13, 2004, p. 87-90.

* cited by examiner

FIG.16
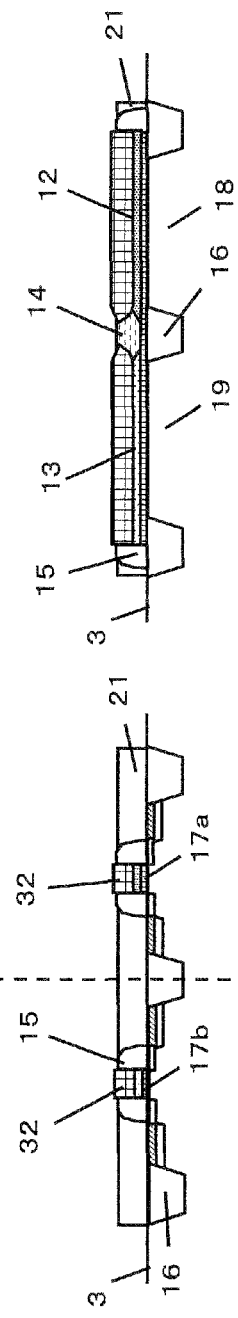
(a)
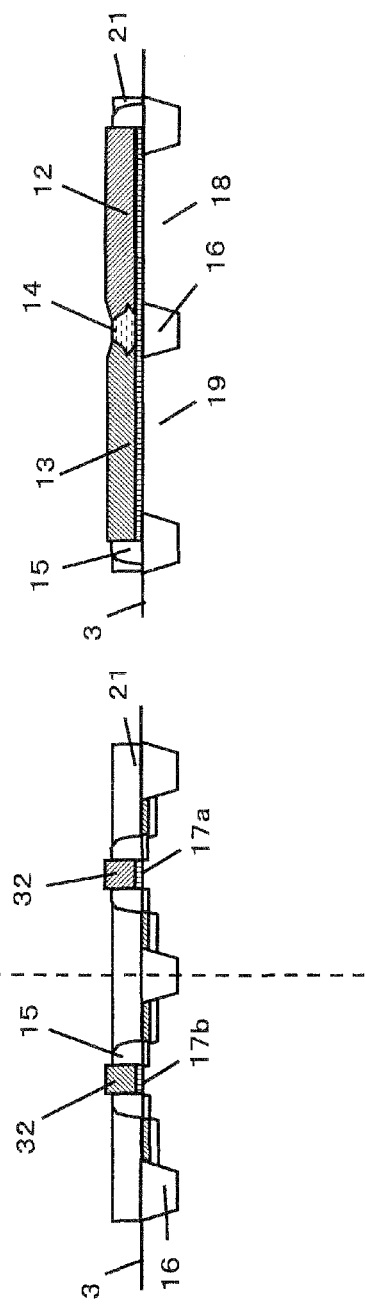
(b)

SEMICONDUCTOR DEVICE AND MANUFACTURING PROCESS THEREFOR

TECHNICAL FIELD

The present invention relates to a semiconductor device comprising an N-type and a P-type field effect transistors and a manufacturing process therefor.

BACKGROUND OF THE INVENTION

Recently, a field effect transistor employing a metal gate electrode made of an alloy material such as a silicided metal has gathered attention. This field effect transistor employing a metal gate electrode has an advantage that it reduces a compound capacity by eliminating depletion in a gate electrode and facilitates control of a $V_{th}$ (threshold voltage) by controlling a work function.

Conventionally, there has been used a semiconductor device comprising an N-type field effect transistor (hereinafter, referred to as an "NMOS transistor") and a P-type field effect transistor (hereinafter, referred to as a "PMOS transistor") in which gate electrodes of these MOS transistors are combined to be a single line electrode. In this semiconductor device, the sections of the line electrode over the N-type and P-type areas formed within the semiconductor substrate correspond to the gate electrodes in each MOS transistor, respectively.

Here, the NMOS transistor and the PMOS transistor are different in properties in terms of the relationship between a work function of the material for the gate electrode and a $V_{th}$ of the MOS transistor. In a semiconductor device in which an NMOS and a PMOS transistors are connected as a single line, it is, therefore, necessary to individually optimize a $V_{th}$ of each MOS transistor by forming sections of the line electrode corresponding to gate electrodes of each MOS transistor from different materials and controlling a work function of the material of each gate electrode.

Thus, a semiconductor device in which gate electrodes for an NMOS and a PMOS transistors are made of different materials has been investigated. Japanese Laid-open Patent Publication No. 2005-167251 (reference 1) has disclosed a semiconductor device in which an NMOS transistor and a PMOS transistor are made of different silicide materials. This semiconductor device is prepared by depositing a first and a second metal-containing layers on polysilicon regions to be an NMOS and a PMOS transistors, respectively, and siliciding the polysilicon regions to be an NMOS and a PMOS transistors at one time by heating.

In addition, Japanese Laid-open Patent Publication No. 2004-221226 (reference 2) has disclosed a semiconductor device in which an NMOS transistor and a PMOS transistor are made of different silicide materials. This semiconductor device can be prepared mainly by one of the following two processes. In a first process, a gate electrode for a first MOS transistor is formed by preheating at a high temperature and then a gate electrode for a second MOS transistor is formed by processing at a low temperature. In a second process, after forming a polysilicon region comprising of two regions containing dopants of different elements from each other, it is silicided at one time by heating, to form the gate electrodes for each MOS transistor.

However, in a semiconductor device according to Japanese Laid-open Patent Publication No. 2005-167251 (reference 1), gate electrodes in an NMOS and a PMOS transistors are simultaneously formed at one time by heating, so that a gate electrode material (a constituent element of a gate electrode) having a larger reaction rate or diffusion coefficient infiltrates the other gate electrode area, leading to a nonuniform composition of the gate electrode. Furthermore, this manufacturing process cannot produce gate electrodes for each MOS transistor under the optimal conditions for the gate electrodes material for the NMOS and the PMOS transistors.

In a semiconductor device according to Japanese Laid-open Patent Publication No. 2004-221226 (reference 2), the first process, when first siliciding a gate pattern 41 on a first MOS transistor as shown in FIG. 1(a), may provide a compositionally nonuniform transition layer 42 due to diffusion of a diffusing species (a constituent element having a larger diffusion coefficient) constituting the gate pattern to the gate pattern over a second MOS transistor. As a result, even after siliciding a gate pattern 43 over the second MOS transistor, the transition layer 42 remains and thus a gate electrode having a uniform composition cannot be formed (FIG. 1(b)). Furthermore, in the second process, due to difference in a diffusion coefficient between dopants contained in two regions 44 and 45 in a polysilicon (FIG. 1(c)), a dopant present in one region infiltrates the other region during heating (siliciding), and thus a gate electrode having a uniform composition cannot be formed (FIG. 1(d)).

Thus, in the semiconductor devices according to Laid-open Patent Publication Nos. 2005-167251 and 2004-221226 (references 1 and 2), a gate electrode composition in each MOS transistor is nonuniform, so that the gate electrode material has a work function deviated from a desired value. Consequently, a desired $V_{th}$ (threshold voltage) cannot be achieved, leading to an uncontrolled $V_{th}$. Such a problem is caused by the fact that the materials of the gate electrodes in each MOS transistor are close to each other, during forming a gate electrode (heating), mutual diffusion between the gate electrode materials occurs, and a gate electrode material (a constituent element of a gate electrode) has diffused from one region to the other region to give a transition layer 42 (FIG. 2(a), (b)).

In view of the above problems, the present invention is characterized in that as shown in FIG. 2(c), a diffusion barrier region capable of preventing diffusion of a gate electrode material constituting each MOS transistor is formed between gate electrode sections for an NMOS transistor and PMOS transistor in a line electrode. Furthermore, an objective of the present invention is to provide a semiconductor device in which each MOS transistor has a uniform gate electrode composition by preventing diffusion of a gate electrode material in each MOS transistor by a diffusion barrier region. Thus, another objective is to provide a semiconductor device exhibiting excellent operation properties by preventing deviation in a work function of a gate electrode material to effectively control a $V_{th}$.

SUMMARY OF THE INVENTION

To solve the above problem, the present invention has the following aspects.

[1] A semiconductor device, comprising:
  an isolation region formed within a semiconductor substrate;
  an N-type region and a P-type region formed within the semiconductor substrate such that the N-type region and the P-type region are isolated by the isolation region;
  a line electrode extending from a region over the N-type region through a region over the isolation region to a region over the P-type region;
  a PMOS transistor comprising a first gate insulating film formed over the N-type region and a first gate electrode which is the line electrode over the N-type region; and an NMOS transistor comprising a second gate insulating film formed over the P-type region and a second gate electrode which is the line electrode over the P-type region, wherein the line electrode comprises an electrode section (A) comprising the first gate electrode, an electrode section (B) comprising the second gate electrode and a diffusion barrier region formed for preventing contact of the electrode sections (A) and (B) over the isolation region, wherein the diffusion barrier region contains an element different from elements in the electrode sections (A) and (B), and the electrode sections (A) and (B) are made of materials containing mutually different elements or of materials containing the same elements in a different composition, and wherein the diffusion barrier region meets at least one of the following conditions (1) and (2):

(1) a diffusion coefficient $D_1$ of the constituent element A' of the electrode section (A) in the diffusion barrier region is lower than an interdiffusion coefficient $D_2$ of the constituent element A' between the electrode section (A) materials;

(2) a diffusion coefficient $D_3$ of the constituent element B' of the electrode section (B) in the diffusion barrier region is lower than an interdiffusion coefficient $D_4$ of the constituent element B' between the electrode section (B) materials.

[2] The semiconductor device as described in [1], wherein the electrode sections (A) and (B) as well as the diffusion barrier region are made of a silicide, and the diffusion barrier region meets the conditions (1) and (2).

[3] The semiconductor device as described in [2], wherein the silicide constituting the diffusion barrier region is a silicide containing a metal element which becomes a diffusing species to silicon during a siliciding reaction.

[4] The semiconductor device as described in [2], wherein the silicide constituting the diffusion barrier region is a silicide of at least one metal element selected from the group consisting of Pt, Pd, Co and Ni.

[5] The semiconductor device as described in any of [2] to [4], wherein the electrode section (A) is made of a silicide represented by $Ni_xSi_{1-x}$ (0.55≦x<1), and the electrode section (B) is made of a silicide represented by $Ni_xSi_{1-x}$ (0<x<0.55).

[6] The semiconductor device as described in [5], wherein the electrode section (A) is made of $Ni_3Si$ or $Ni_2Si$, and the electrode section (B) is made of NiSi or $NiSi_2$.

[7] The semiconductor device as described in any of [2] to [4], wherein the silicides constituting the electrode sections (A) and (B) are dopant-containing silicides which contain dopants consisting of mutually different elements.

[8] The semiconductor device as described in [7], wherein the electrode section (A) is made of NiSi containing B, Al or In as the dopant, and the electrode section (B) is made of NiSi containing P, As or Sb as the dopant.

[9] The semiconductor device as described in any of [2] to [4], wherein the silicides constituting the electrode sections (A) and (B) are a refractory metal silicide.

[10] The semiconductor device as described in [1], wherein the electrode sections (A) and (B) as well as the diffusion barrier region contain the same metal element M1, the diffusion barrier region is made of a silicide of the metal element M1, and the metal element M1 is such an element that in a siliciding reaction of the metal element M1, silicon is a diffusing species to the metal element M1.

[11] The semiconductor device as described in [10], wherein the diffusion barrier region meets only the condition (1), the metal element M1 is Ru, and the electrode section (A) and the electrode section (B) are made of RuTa and Ru, respectively.

[12] A semiconductor device, comprising:

an isolation region formed within a semiconductor substrate;

an N-type region and a P-type region formed within the semiconductor substrate such that the N-type region and the P-type region are isolated by the isolation region;

a line electrode extending from a region over the N-type region through a region over the isolation region to a region over the P-type region;

a PMOS transistor comprising a first gate insulating film formed over the N-type region, and a first gate electrode which is the line electrode over the N-type region and which is made of an $Ni_3Si$ region or $Ni_2Si$ region; and an NMOS transistor comprising a second gate insulating film formed over the P-type region, and a second gate electrode which is the line electrode over the P-type region and which is made of an NiSi region or $NiSi_2$ region, wherein the line electrode comprises an electrode section (A) comprising the first gate electrode formed over the N-type region, an electrode section (B) comprising the second gate electrode formed over the P-type region, and a region (C) formed over the isolation region such that the region (C) prevents contact of the electrode sections (A) and (B), the region (C) being made of a Pt silicide or Co silicide.

[13] The semiconductor device as described in any of [12], wherein a length of the region (C) in an extension direction of the line electrode is equal to or more than a length of the line electrode in a normal line direction of the semiconductor substrate and equal to or less than a length of the isolation region in an extension direction of the line electrode.

[14] The semiconductor device as claimed in described in any of [1] to [13], wherein the NMOS transistor and the PMOS transistor constitute a CMOS transistor.

[15] The semiconductor device as described in any of [1] to [14], wherein the NMOS transistor and the PMOS transistor constitute a CMOS transistor.

[16] A process for manufacturing the semiconductor device as described in [1], comprising preparing the semiconductor substrate comprising the N-type region and the P-type region which are isolated by the isolation region;

forming a gate insulating film on the semiconductor substrate;

forming a polysilicon gate pattern extending from a region over the N-type region through a region over the isolation region to a region over the P-type region;

forming a mask over the gate pattern;

removing a part of the mask formed on the gate pattern over the isolation region to expose the polysilicon;

depositing a layer of a silicide-formable metal M2 on the exposed polysilicon;

reacting the metal M2 and the polysilicon by heating to form the diffusion barrier region such that a silicide of the metal M2 is formed until it comes into contact with the gate insulating film over the isolation region and the silicide of the metal M2 is absent over the N-type region and the P-type region, as a first siliciding step;

removing the layer of the metal M2 which is unreacted with the polysilicon during the first siliciding step; and converting gate pattern sections over the N-type region and over the P-type region which are separated by the diffusion barrier region into the electrode sections (A) and (B) made of a silicide, respectively, as a second siliciding step.

[17] The process for manufacturing the semiconductor device as described in [16], wherein the metal M2 is Pt, and the second siliciding step comprises:

removing the mask remaining on the gate pattern sections over the N-type and P-type regions;

depositing an Ni layer on the gate patterns;

reacting the polysilicon constituting the gate pattern sections over the N-type and the P-type regions with the Ni by heating to form NiSi regions;

removing the Ni layer unreacted with the polysilicon;

forming a mask on the NiSi region over the P-type region;

depositing an Ni layer on the NiSi region over the N-type region;

reacting the NiSi constituting the NiSi region over the N-type region with the Ni by heating to form $Ni_3Si$;

removing the Ni layer unreacted with the NiSi; and removing the mask formed on the NiSi region over the P-type region.

[18] The process for manufacturing the semiconductor device as described in [16], wherein in forming the gate pattern, dopant-containing polysilicons are formed such that the dopant-containing polysilicons over the N-type and the P-type regions contain dopants consisting of different elements, as the polysilicon, the metal M2 is Pt; and the second siliciding step comprises:

removing the mask remaining on the gate pattern sections over the N-type and P-type regions;

depositing an Ni layer on the gate patterns;

reacting dopant-containing polysilicons constituting the gate pattern sections over the N-type and the P-type regions with the Ni by heating, respectively, to form dopant-containing NiSi regions; and removing the Ni layer unreacted with the dopant-containing polysilicon.

[19] The process for manufacturing the semiconductor device as described in [16], wherein wherein the metal M2 is Co, and the second siliciding step comprises:

removing the mask formed on the gate pattern section over the N-type region;

depositing an Mo layer on the gate pattern section over the N-type region;

reacting the Mo with the polysilicon constituting the gate pattern section over the N-type region by heating to form $MoSi_2$;

removing the Mo layer unreacted with the polysilicon;

removing the mask formed on the gate pattern section over the P-type region;

depositing a Hf layer on the gate pattern section over the P-type region;

reacting the Hf with the polysilicon constituting the gate pattern section over the P-type region by heating to form HfSi; and removing the Hf layer unreacted with the polysilicon.

[20] A process for manufacturing the semiconductor device as described in [1], comprising:

preparing the semiconductor substrate comprising the N-type region and the P-type region which are isolated by the isolation region;

forming a gate insulating film on the semiconductor substrate;

forming a polysilicon gate pattern extending from a region over the N-type region through a region over the isolation region to a region over the P-type region;

forming a mask over the gate pattern;

removing the mask formed on gate pattern sections over the N-type and the P-type regions to expose the polysilicon;

depositing a layer of a silicide-formable metal M3 on the exposed polysilicon;

reacting the metal M3 with the exposed polysilicon by heating to converting at least part of the gate pattern sections over the N-type and the P-type regions into metal M3 silicide regions such that the gate pattern sections of the N-type and the P-type regions are not mutually communicated over the isolation region, as a third siliciding step;

removing the layer of the metal M3 unreacted with the polysilicon during the third siliciding step;

removing the mask remaining on the gate pattern over the isolation region to expose the polysilicon;

depositing a layer of a silicide-formable metal M4 on the exposed polysilicon;

reacting the metal M4 with the exposed polysilicon by heating to form the diffusion barrier region such that a silicide of the metal M4 is formed until it comes into contact with the gate insulating film over the isolation region and the silicide of the metal M4 is absent over the N-type region and the P-type region, as a fourth siliciding step;

removing the layer of the metal M4 unreacted with the polysilicon during the fourth siliciding step; and converting the metal M3 silicide regions over the N-type and the P-type regions into the electrode sections (A) and (B), respectively, as a fifth siliciding step.

[21] The process for manufacturing the semiconductor device as described in [20], wherein the third siliciding step is reacting the metal M3 with the upper part of the polysilicon to form an $Ni_2Si$ region and to leave the unreacted polysilicon in the lower part of the $Ni_2Si$ region, the metal M4 is Pt, and the fifth siliciding step comprises:

reacting the $Ni_2Si$ constituting the $Ni_2Si$ region with the polysilicon remaining in the lower part of the $Ni_2Si$ region by heating to form an NiSi region;

forming a mask on the NiSi region over the P-type region;

depositing an Ni layer on the NiSi region over the N-type region;

reacting the NiSi constituting the NiSi region over the N-type region with the Ni by heating to form $Ni_3Si$;

removing the Ni layer unreacted with the NiSi; and removing the mask formed on the NiSi region over the P-type region.

[22] The process for manufacturing the semiconductor device as described in [20],
wherein the third siliciding step is reacting the metal M3 with all the polysilicon constituting the gate pattern sections over the N-type and the P-type regions to form an NiSi region,
the metal M4 is Pt, and
the fifth siliciding step comprises:
forming a mask on the NiSi region over the P-type region;
depositing an Ni layer on the NiSi region over the N-type region;
reacting the NiSi constituting the NiSi region over the N-type region with the Ni by heating to form $Ni_3Si$;
removing the Ni layer unreacted with the NiSi; and
removing the mask formed on the NiSi region over the P-type region.

[23] The process for manufacturing the semiconductor device as described in [20],
wherein in forming the gate pattern, dopant-containing polysilicons are formed such that dopant-containing polysilicons over the N-type and the P-type regions contain dopants of different elements, as the polysilicon,
the third siliciding step is reacting the metal M3 with the upper part of the dopant-containing polysilicon to form a dopant-containing $Ni_2Si$ region and to leave the unreacted dopant-containing polysilicon in the lower part of the dopant-containing $Ni_2Si$ region,
the metal M4 is Pt, and
the fifth siliciding step comprises the step of reacting the dopant-containing $Ni_2Si$ constituting the dopant-containing $Ni_2Si$ region with the dopant-containing polysilicon remaining in the lower part of the dopant-containing $Ni_2Si$ region by heating to form a dopant-containing NiSi.

[24] A process for manufacturing the semiconductor device as described in [1], comprising:
preparing the semiconductor substrate comprising the N-type region and the P-type region which are isolated by the isolation region;
forming a gate insulating film on the semiconductor substrate;
forming a gate pattern made of Ru extending from a region over the N-type region through a region over the isolation region to a region over the P-type region;
forming a mask over the gate pattern,
removing a part of the mask formed on the gate pattern over the isolation region to expose the Ru;
depositing a silicon layer on the exposed Ru;
reacting the Ru with the silicon by heating to form the diffusion barrier region such that a silicide of the Ru is formed until it comes into contact with the gate insulating film over the isolation region and the silicide of Ru is absent over the N-type region and the P-type region, as a sixth siliciding step;
removing the silicon layer unreacted with the Ru in the sixth siliciding step;
removing the mask remaining on the gate pattern section over the N-type region;
depositing a Ta layer on the gate pattern section over the N-type region;
reacting the Ru constituting the gate pattern section over the N-type region with the Ta by heating to form RuTa;
removing the Ta layer unreacted with the Ru; and
removing the mask remaining on the gate pattern section over the P-type region.

[25] A semiconductor device, comprising
an isolation region formed within a semiconductor substrate,
an N-type region and a P-type region formed within the semiconductor substrate such that the N-type region and the P-type region are isolated by the isolation region,
a line electrode extending from a region over the N-type region through a region over the isolation region to a region over the P-type region,
a PMOS transistor comprising a first gate insulating film formed over the N-type region and a first gate electrode which is the line electrode over the N-type region, and
an NMOS transistor comprising a second gate insulating film formed over the P-type region and a second gate electrode which is the line electrode over the P-type region,
wherein the line electrode comprises an electrode section (A) made of a first metal silicide comprising the first gate electrode, an electrode section (B) made of a second metal silicide comprising the second gate electrode and a region (D) made of a third metal silicide which is formed for preventing contact of the electrode sections (A) and (B) over the isolation region,
wherein the third metal is an element different from the first and the second metal and the first and the second silicides are made of materials containing mutually different elements or of materials containing the same elements in a different composition, and
wherein in the region (D),
a diffusion coefficient $D_1$ for the first metal and silicon in the region (D) is less than an interdiffusion coefficient $D_2$ between the first metal and silicon, and
a diffusion coefficient $D_3$ for the second metal and silicon in the region (D) is less than an interdiffusion coefficient $D_4$ between the second metal and silicon.

In [25], magnitude relation between diffusion coefficients $D_1$ and $D_2$ is determined by comparing $D_1$ with $D_2$ of the first metal and comparing $D_1$ with $D_2$ of silicon, respectively. Furthermore, magnitude relation between diffusion coefficients $D_3$ and $D_4$ is determined by comparing $D_3$ with $D_4$ of the second metal and comparing $D_3$ with $D_4$ of silicon, respectively.

[26] The semiconductor device as described in [25], wherein the interdiffusion coefficient $D_2$ is at least one of the following diffusion coefficients $D_5$ and $D_6$:
a diffusion coefficient $D_5$ of silicon in a silicide which is convertible to the first metal silicide and in which a content of the first metal is higher than that in the first metal silicide, and
a diffusion coefficient $D_6$ of the first metal in a silicide which is convertible to the first metal silicide and in which a content of silicon is higher than that in the first metal silicide.

[27] The semiconductor device as described in [25] or [26], wherein the interdiffusion coefficient $D_4$ is at least one of the following diffusion coefficients $D_7$ and $D_8$:
a diffusion coefficient $D_7$ of silicon in a silicide which is convertible to the second metal silicide and in which a content of the second metal is higher than that in the second metal silicide, and a diffusion coefficient $D_8$ of the second metal in a silicide which is convertible to the second metal silicide and in which a content of silicon is higher than that in the second metal silicide.

The terms, "convertible to the first metal silicide" and "convertible to the second metal silicide" as used herein mean that under the conditions feasible in the manufacturing process, composition ratios in a silicide containing a first metal and a silicide containing a second metal can be converted into composition ratios in the first metal silicide and the second metal silicide (a composition ratio of the first metal or the second metal to silicon).

[28] The semiconductor device as described in any of [25] to [27], wherein the third metal is Pt, Pd or Co.

[29] The semiconductor device as described in any of [25] to [28], wherein the first metal silicide is $Ni_3Si$ or $Ni_2Si$ and the second metal silicide is NiSi or $NiSi_2$.

[30] The semiconductor device as described in any of [25] to [28], wherein the first metal silicide is $MoSi_2$ and the second metal silicide is HfSi.

[31] The semiconductor device as described in any of [25] to [28], wherein the first metal silicide is NiSi containing B, Al or In as a dopant; the third metal silicide is PtSi, $Pt_2Si$, $Pd_2Si$, CoSi or $CoSi_2$ containing a dopant; and the second metal silicide is NiSi containing P, As or Sb as a dopant.

[32] The semiconductor device as described in any of [25] to [31], wherein the diffusion coefficient $D_1$ is equal to or less than one tenth of the interdiffusion coefficient $D_2$.

[33] The semiconductor device as described in any of [25] to [32], wherein the diffusion coefficient $D_3$ is equal to or less than one tenth of the interdiffusion coefficient $D_4$.

Here, it is preferable that in each of the first metal and silicon $D_1$ is equal to or less than one tenth of $D_2$, and in each of the second metal and silicon $D_3$ is equal to or less than one tenth of $D_4$.

[34] A semiconductor device, comprising
an isolation region formed within a semiconductor substrate,
an N-type region and a P-type region formed within the semiconductor substrate such that the N-type region and the P-type region are isolated by the isolation region,
a line electrode extending from a region over the N-type region through a region over the isolation region to a region over the P-type region,
a PMOS transistor comprising a first gate insulating film formed over the N-type region and a first gate electrode which is the line electrode over the N-type region, and
an NMOS transistor comprising a second gate insulating film formed over the P-type region and a second gate electrode which is the line electrode over the P-type region,
wherein the line electrode comprises an electrode section (A) made of RuTa comprising the first gate electrode, an electrode section (B) made of Ru comprising the second gate electrode and a region (D) made of Ru silicide which is formed for preventing contact of the electrode sections (A) and (B) over the isolation region.

[35] The semiconductor device as described in any of [25] to [34], wherein a length of the region (D) in an extension direction of the line electrode is equal to or more than a length of the line electrode in a normal-line direction of the semiconductor substrate and equal to or less than a length of the isolation region in an extension direction of the line electrode.

The present invention can provide a semiconductor device where a line electrode comprises a diffusion barrier region between gate electrodes (over an isolation region) constituting an NMOS and a PMOS transistors, so that mutual diffusion of gate electrode materials (a constituent element A' of an electrode section (A) and a constituent element B' of an electrode section (B)) is prevented between the materials of the gate electrodes. Furthermore, there can be provided a semiconductor device exhibiting excellent operation properties, in which each MOS transistor has a uniform gate electrode composition, a work function in a material for the gate electrode is not deviated, and a $V_{th}$ (threshold voltage) is controlled to a desired value.

BRIEF DESCRIPTION OF THE DRAWINGS

FIG. 16 shows Embodiment 5 of the manufacturing process according to the present invention.

Figure 1:
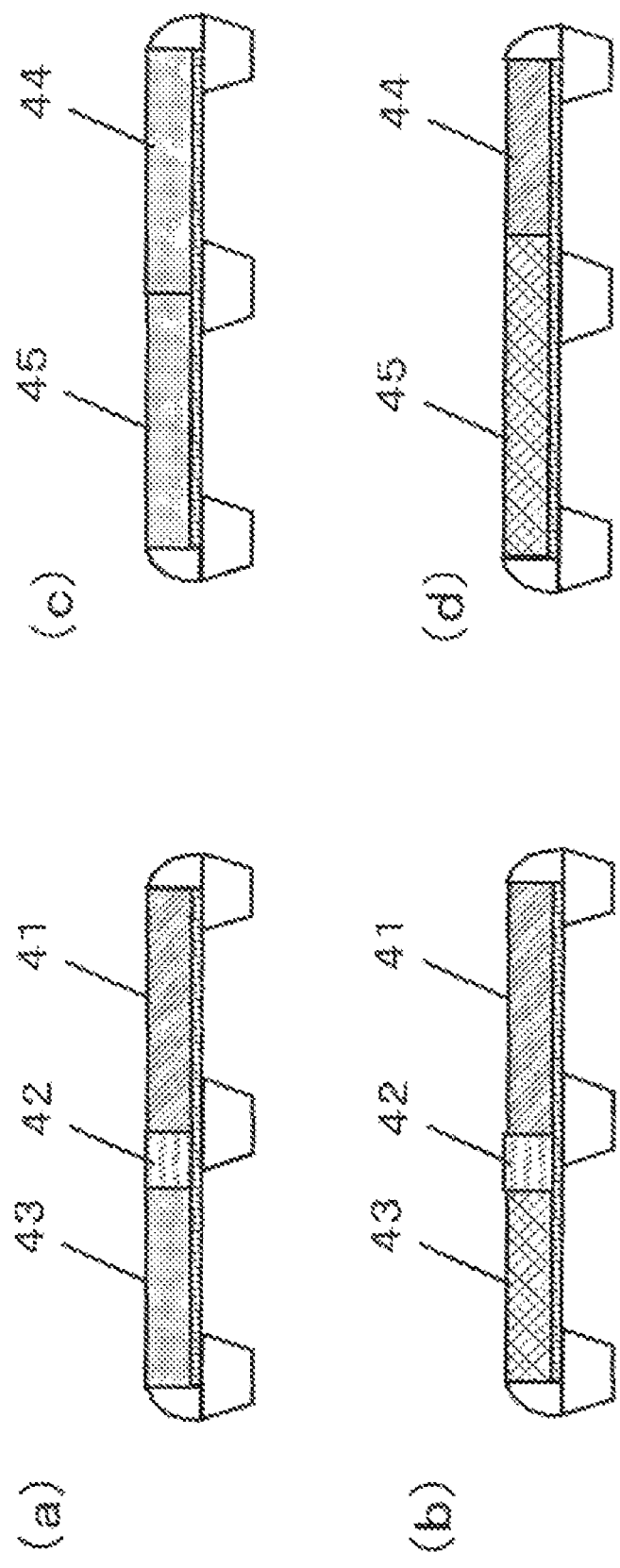
FIG. 1 illustrates the problem in a conventional CMOS transistor.
Figure 2:
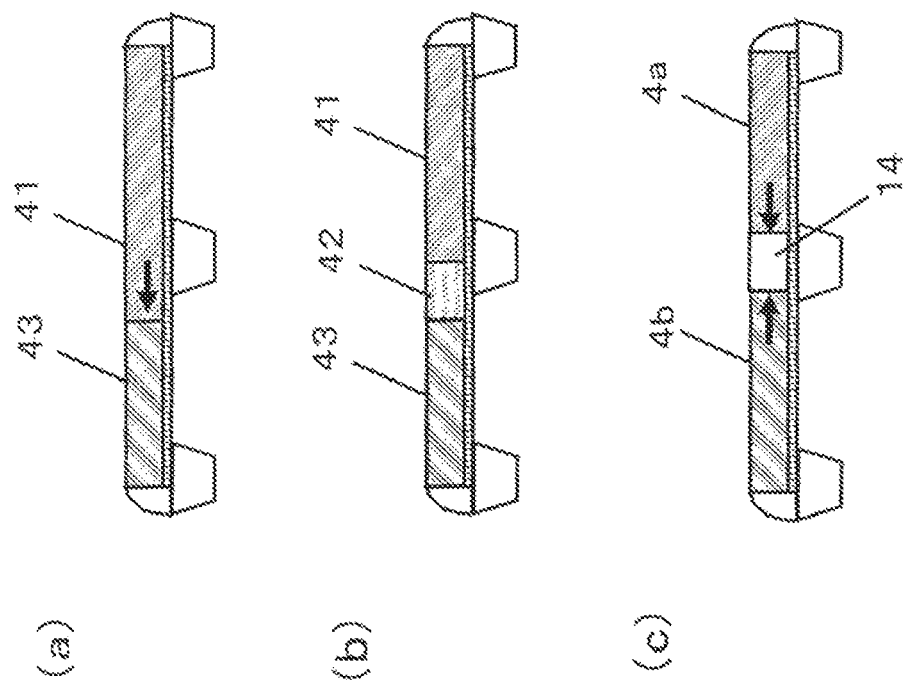
FIG. 2 illustrates the problem in a conventional CMOS transistor.

The symbols in the drawings have the following meanings; 1: NMOS transistor, 2: PMOS transistor, 3: semiconductor substrate, 4a: first gate electrode, 4b: second gate electrode, 5a: first source/drain regions, 5b: second source/drain regions, 10: line electrode, 12: gate pattern section over an N-type region, 13: gate pattern section over a P-type region, 14: diffusion barrier region, 15: gate sidewall, 16: isolation region, 17a: first gate insulating film, 17b: second gate insulating film, 18: N-type region, 19: P-type region, 20: hard mask, 21: interlayer insulating film, 22: silicide, 23: Pt layer, 24: Ni layer, 25: Co layer, 26: Mo layer, 27: Hf layer, 28: Si layer, 29: Ta layer, 31: extension direction of a line electrode, 32: gate pattern, 46: normal-line direction of a semiconductor substrate, 51: electrode section (A), and 52: electrode section (B).

DETAILED DESCRIPTION OF THE INVENTION

1. Semiconductor Device

Figure 3:
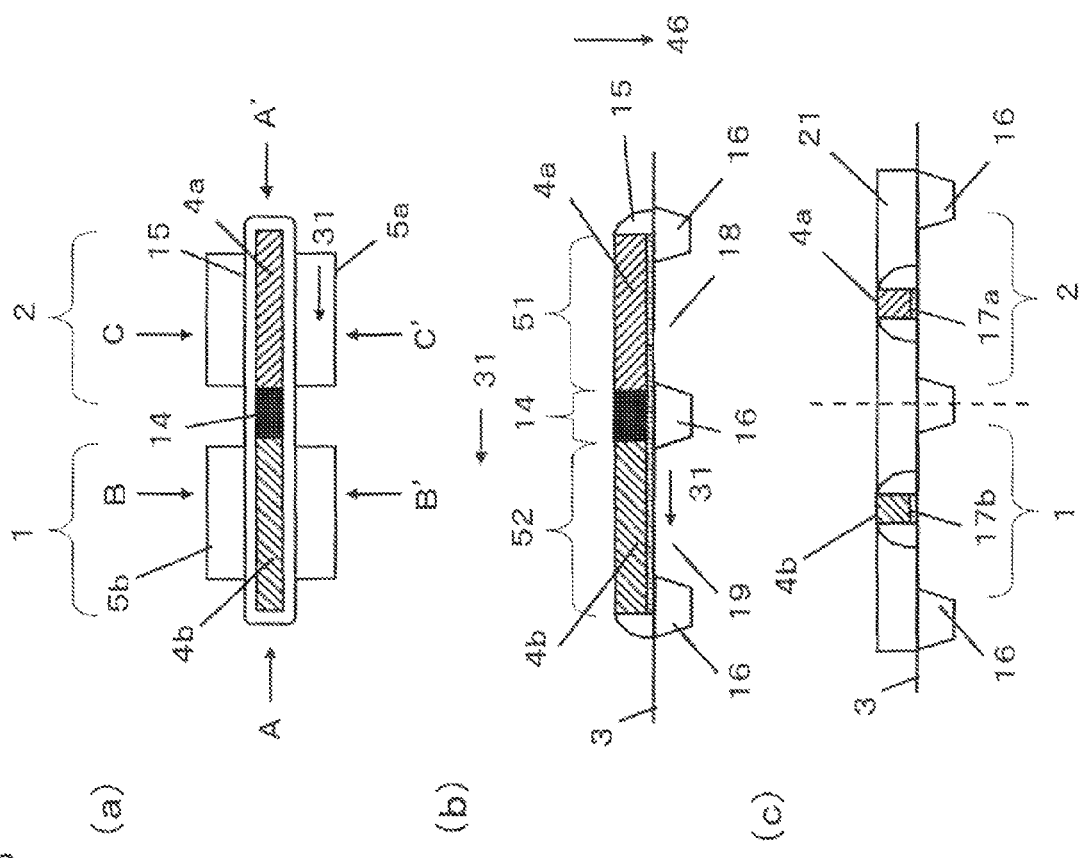
FIG. 3 illustrates a CMOS transistor according to the present invention.

FIG. 3 shows an example of a semiconductor device according to the present invention. FIG. 3(a) is a plane view of the semiconductor device, FIG. 3(b) is an A-A' cross-sectional view of the semiconductor device in FIG. 3(a), and FIG. 3(c) shows a B-B' cross-sectional view of an NMOS transistor and a C-C' cross-sectional view of a PMOS transistor which constitute the semiconductor device of FIG. 3(a). FIG. 3(c) is a combination of the cross-sectional views of the NMOS transistor and the PMOS transistor taken on different lines, but not a cross-sectional view of the semiconductor device of the present invention taken on one line (the broken line in FIG. 3(c) indicates that each MOS transistor is seen from a different cross-section. Hereinafter, the same is also applied to FIGS. 4 to 21).

As shown in FIG. 3, the semiconductor device of the present invention is a semiconductor device comprising an NMOS transistor 1 and a PMOS transistor 2. In this semiconductor device, there are formed an N-type region (N-type semiconductor region; N well) 18 and a P-type region (P-type semiconductor region; P well) 19 which are isolated by an isolation region 16 within a semiconductor substrate 3. A first gate insulating film 17a and a second gate insulating film 17b are formed over the N-type region 18 and P-type region 19, respectively. From an N-type region 18 through an isolation region 16 to a P-type region 19, a single line electrode is formed, extending in the direction of an arrow 31. In the line electrode, the section over the N-type region 18 constitutes a first gate electrode 4a and the section over the P-type region 19 constitutes a second gate electrode 4b. On the side of the line electrode, there is a gate sidewall 15. Within the semiconductor substrate, a first source/a drain region 5a and a second source/a drain region 5b are formed, such that the first source/the drain regions 5a and the second source/the drain regions 5b sandwich the first gate electrode 4a and the second gate electrode 4b, respectively.

The N-type region 18, the first gate insulating film 17a, the first gate electrode 4a, the first source/the drain region 5a and the gate sidewall 15 constitute the PMOS transistor 2, and the P-type region 19, the second gate insulating film 17b, the second gate electrode 4b, the second source/the drain region 5b and the gate sidewall 15 constitute the NMOS transistor 1.

This line electrode comprises an electrode section (A) 51 formed over the N-type region, an electrode section (B) 52 formed over the P-type region and a diffusion barrier region 14. The electrode section (A) 51 and the electrode section (B) 52 comprise the first gate electrode 4a and the second gate electrode 4b, respectively, and comprise at least the sections of the line electrode over the N-type region and P-type region. The electrode sections (A) 51 and (B) 52 may further extend from here to the side of the line electrode section over the isolation region (diffusion barrier region). Alternatively, the electrode sections (A) 51 and (B) 52 may correspond to the first gate electrode 4a and the second gate electrode 4b, respectively. However, between the electrode sections (A) and (B), there must be a diffusion barrier region 14 for preventing contact between the electrode sections (A) and (B) (for separation).

The diffusion barrier region 14 is formed in a part or whole length of the line electrode over the isolation region (it is formed such that a length of the diffusion barrier region 14 in an extension direction of the line electrode is equal to or less than a length of the isolation region in an extension direction of the line electrode). The diffusion barrier region 14 does not extend to the line electrode section over the N-type region and the P-type region. Even when a length of the isolation region in an extension direction of the line electrode varies in relation to a normal line direction of the semiconductor substrate, the diffusion barrier region 14 is similarly formed in the line electrode over the isolation region, but not in the line electrode over the N-type region or the P-type region. The diffusion barrier region 14 is formed over the isolation region for substantially preventing contact between the electrode sections (A) 51 and (B) 52, and is formed in the whole length of the line electrode over the isolation region in a normal line direction of the substrate 46 to divide it into the electrode sections (A) 51 and (B) 52.

This diffusion barrier region contains a different element from those in the electrode sections (A) and (B). The electrode sections (A) and (B) (the first gate electrode 4a and the second gate electrode 4b) are made of different materials (materials containing different elements) or of materials containing the same elements in different compositions. With such a structure where the electrode sections (A) and (B) are made of different materials or of materials containing the same elements in different components, each of the first gate electrode 4a and the second gate electrode 4b can be controlled to have desired work function and $V_{th}$, depending on the properties of each MOS transistor. With the diffusion barrier region containing a different element from those in the electrode sections (A) and (B), the diffusion barrier region can effectively prevent mutual diffusion of the constituent element A' and B' between the gate electrode materials (between the electrode section (A) material and the electrode section (B) material) during forming the gate electrode.

The term, "materials containing different elements" as used herein encompasses a case where the first gate electrode and the second gate electrode contain the same components as main components and only one of the gate electrodes contains a dopant or where these gate electrodes contain dopants of different elements.

In a semiconductor device of the present invention, a diffusion barrier region can prevent mutual diffusion between the gate electrode materials, so that the first gate electrode 4a and the second gate electrode 4b are made of a uniform material without contamination with another gate electrode material. Thus, deviation of a work function due to nonuniformity in a composition can be prevented, so that a $V_{th}$ can be controlled to a predetermined value. As a result, a semiconductor device excellent in a driving speed and operation properties can be obtained.

Furthermore, a similar effect can be expected in a combination of a high-dielectric insulating film with a gate electrode of the present invention.

The NMOS transistor and the PMOS transistor are disposed such that their gate-length directions (channel-length direction; a direction between the source/drain regions) are parallel.

Examples of a preferable size of each component in a line electrode of the present invention are indicated below.

Electrode Section (A), Electrode Section (B)
Length in an extension direction of the line electrode: 500 to 20,000 nm
Length in a gate-length direction: 30 to 1,000 nm
Height: 20 to 200 nm.
First Gate Electrode, Second Gate Electrode
Length in an extension direction of the line electrode: 250 to 1,000 nm
Diffusion Barrier Region
Length in an extension direction of the line electrode: 50 to 10,000 nm.

A length of the diffusion barrier region in an extension direction of the line electrode is preferably 500 to 8,000 nm, more preferably 1,000 to 6,000 nm, further preferably 1,500 to 4,000 nm, particularly preferably 1,500 to 2,500 nm. With a length of the diffusion barrier region in an extension direction of the line electrode within these ranges, a semiconductor device with a higher integrity and comprising gate electrodes with a uniform composition can be obtained.

For example, when forming a diffusion barrier region by an isotropic reaction, a length of the line electrode in the electrode section (A), the electrode section (B) and the diffusion barrier region in an extension direction may vary in relation to the normal line direction of the substrate (for example, the semiconductor devices in FIG. 6(b) and FIG. 9(c), etc). In such a semiconductor device, it is preferable that for the electrode section (A), the electrode section (B) and the diffusion barrier region, a length in an extension direction of the line electrode, which vary in relation to the normal line direction of the substrate, has the maximum and the minimum within the ranges of lengths of the electrode section (A), the electrode section (B) and the diffusion barrier region in an extension direction of the line electrode.

In a semiconductor device of the present invention, a CMOS transistor may be constituted by an NMOS transistor and a PMOS transistor.

There will be described each component constituting a gate electrode according to the present invention.

Diffusion Barrier Ion

The diffusion barrier region of the present invention is formed partly or wholly over the isolation region in the line electrode for preventing contact between the electrode sections (A) and (B) (for separating them).

The electrode sections (A) and (B) are formed in one step or in multiple steps. When the electrode sections (A) and (B) are formed in one step, the diffusion barrier region acts to prevent mutual diffusion of the constituent elements A' and B' between the gate electrode materials (mutual diffusion of the constituent element A' between the electrode section (A) materials, and mutual diffusion of the constituent element B' between the electrode section (B) materials) during the one step formation of the electrode sections (A) and (B). Furthermore, when the electrode sections (A) and (B) are formed in multiple steps, it act to prevent mutual diffusion of the constituent elements A' and B' between the gate electrode materials in all steps. Thus, a composition of a gate electrode in each MOS transistor can be made uniform. In the present invention, this region act to prevent diffusion of an electrode section material in all steps for manufacturing at least one electrode section of the electrode sections (A) and (B).

The diffusion barrier region of the present invention, therefore, has a configuration meeting at least one of the following (1) and (2).

(1) A diffusion coefficient $D_1$ of the constituent element A' of the electrode section (A) in the diffusion barrier region is lower than an interdiffusion coefficient $D_2$ of the constituent element A' between the electrode section (A) materials.

(2) A diffusion coefficient $D_3$ of the constituent element B' of the electrode section (B) in the diffusion barrier region is lower than an interdiffusion coefficient $D_4$ of the constituent element B' between the electrode section (B) materials.

The semiconductor device of the present invention just has to meet one or both of the above conditions (1) and (2). An example of a semiconductor device meeting only the above condition (1) is a semiconductor device where the electrode section (A) is made of RuTa, the electrode section (B) is made of Ru and the diffusion barrier region is made of Ru silicide.

There will be described "an electrode section (A) material", "an electrode section (B) material", "a constituent element A' of an electrode section (A)", "a constituent element B' of an electrode section (B)", "a diffusion coefficient $D_1$ (or $D_3$) in a diffusion barrier region" and "an interdiffusion coefficient $D_2$ of a constituent element A' between electrode section (A) materials" in the present specification.

(a) "Electrode Section (A) Material" and "Electrode Section (B) Material"

"An electrode section (A) material" and "an electrode section (B) material" are defined as described below.

"An electrode section (A) material" and "an electrode section (B) material" refer to any material for forming electrode sections (A) and (B). These materials contain starting materials for forming the electrode sections (A) and (B). Furthermore, when an intermediate form (a form which can be generated under feasible conditions as a manufacturing process) may be generated in a process for finally preparing the desired electrode sections (A) and (B) from the starting materials, the intermediate form may be included in the electrode section (A) and (B) materials.

When "an electrode section (A) material" and "an electrode section (B) material" contain a dopant, the dopant is not included by itself in the "electrode section (A) material" and the "electrode section (B) material" because the dopant content is in a trace amount.

The materials finally constituting the electrode sections (A) and (B) are not included in the "electrode section (A) material" and the "electrode section (B) material".

(b) "A constituent Element A' of an Electrode Section (A)", "A Constituent Element B' of an electrode section (B)"

"A constituent element A' of an electrode section (A)", "a constituent element A' of an electrode section (A)" and "a constituent element B' of an electrode section (B)" are defined as described below.

"A constituent element A' of an electrode section (A)" and "a constituent element B' of an electrode section (B)" refer to all elements constituting the final electrode sections (A) and (B), respectively, and a dopant is also included in these constituent elements.

Elements contained in a starting material or an intermediate form possibly generated in a process for finally manufacturing the desired electrode sections (A) and (B) from the starting material, which are not contained in the final electrode section (A) and (B) are not the "constituent element A' of an electrode section (A)" and the "constituent element B' of an electrode section (B)" described above.

A dopant element contained in the final electrode sections (A) and (B), even in a trace amount, falls into a constituent element A' or B'.

(c) "An Interdiffusion Coefficient $D_2$ of a Constituent Element A' Between Electrode Section (A) Materials"

"An interdiffusion coefficient $D_2$ of a constituent element A' between electrode section (A) materials" is defined as described below.

When an electrode section (A) is made of two or more elements or when two or more electrode section (A) materials are used in a process for manufacturing an electrode section (A), the term means a diffusion coefficient in mutual diffusion of the constituent element A' occurring between the electrode section (A) materials.

When one of the electrode sections (A) and (B) is made of one element or when only one electrode material is supposed, an interdiffusion coefficient $D_2$ of a constituent element A' between electrode section (A) materials cannot be defined.

For example, when an electrode section is formed from a first electrode section (A) material containing a constituent element A1' and a second electrode section (A) material containing a constituent element A2', $D_2$ means a diffusion coefficient of the constituent element A1' from the first into the second electrode section (A) materials and a diffusion coefficient of the constituent element A2' from the second into the first electrode section (A) materials (provided that both constituent elements A1' and A2' are elements falling into the constituent element A' and different each other).

(d) "An Interdiffusion coefficient $D_4$ of a Constituent Element B' Between Electrode Section (B) Materials"

"An interdiffusion coefficient $D_4$ of a constituent element B' between electrode section (B) materials" is defined as described for the above "interdiffusion coefficient $D_2$ of a constituent element A' between electrode section (A) materials". In this regard, however, in the definition of the above "interdiffusion coefficient $D_2$ of a constituent element A' between electrode section (A) materials", "an electrode section (B)" and "a constituent element B'" are substituted for "an electrode section (A)" and "a constituent element A'", respectively.

(e) A Constituent Element C' of a Diffusion Barrier Region

A constituent element C' of a diffusion barrier region means an element constituting a final diffusion barrier region.

(f) A Diffusion Coefficient $d_1$ of a Constituent Element C' of a Diffusion Barrier Region in an Electrode Section (A) and a Diffusion Coefficient $d_2$ of a Constituent Element C' of Diffusion Barrier Region in an Electrode Section (B)

A diffusion coefficient $d_1$ means a diffusion coefficient of the above constituent element C' in the final electrode section (A).

A diffusion coefficient $d_2$ means a diffusion coefficient of the above constituent element C' in the final electrode section (B).

When each of the constituent elements A' and B' consist of a plurality of elements, each of the diffusion coefficients $D_1$ to $D_4$ include a plurality of values. Magnitude relation between the diffusion coefficients $D_1$ and $D_2$ or $D_3$ and $D_4$ is determined by comparing them for the same element. Specifically, when each of the constituent elements A' and B' consists of a plurality of elements, magnitude relation between the diffusion coefficients $D_1$ and $D_2$ or $D_3$ and $D_4$ is determined for each constituent element. Typically, each of the constituent elements A' and B' consist of two elements, one of which is silicon. When one of the electrode sections (A) and (B) is made of one element or only one electrode material can be supposed, magnitude relation between the above diffusion coefficients $D_1$ and $D_2$ (or $D_3$ and $D_4$) is not determined for this electrode section.

In "A diffusion coefficient $D_1$ (or $D_3$) within a diffusion barrier region", a diffusion barrier region means a final diffusion barrier region. For example, when the electrode section (A), the electrode section (B) and the diffusion barrier region are made of $Ni_3Si$, NiSi and PtSi, respectively, the constituent elements A' and B' are Ni and Si, respectively, and the diffusion coefficients $D_1$ and $D_3$ mean diffusion coefficients of Ni and Si, respectively in PtSi.

The above terms will be further described with reference to specific examples.

For example, (I) when only the following reaction:

  (Equation 1)

is supposed during forming the electrode section (A) or (B), mutual diffusion occurs between elements A* and B* (Equation 1), so that an interdiffusion coefficient $D_2$ or $D_4$ is a diffusion coefficient of B* in A* and a diffusion coefficient of A* in B*.

(II) when the following multiple reactions:

  (Equation 2)

  (Equation 3)

are supposed during forming the electrode section (A) or (B), mutual diffusion occurs between the elements A* and B* (Equation 2) as well as $A^*_x B^*_{y1}$ and B* (Equation 3). Thus, a diffusion coefficient $D_2$ or $D_4$ is a diffusion coefficient of B* in A*, a diffusion coefficient of A* in B* and a diffusion coefficient of B* in $A^*_x B^*_{y1}$.

Thus, when the electrode sections (A) and (B) are formed by an addition reaction of the constituent elements and the electrode sections (A) and (B) can be formed from the constituent elements A' and B' through multiple steps in a manufacturing process (crystal structure; a stably maintainable structure), an intermediate form (in the above (II), $A^*_x B^*_{y1}$) corresponding to an intermediate step of the multiple steps exists. On the other hand, when only one form is supposed from the constituent elements A' and B' in the process (the above case (I)), no intermediate forms exist until the final electrode sections (A) and (B) are formed.

$D_2$ and $D_4$ correspond to diffusion coefficients of the constituent elements A' and B' contained in the electrode section materials between the electrode section materials in each step to formation of the electrode sections (A) and (B) (Equation 1 for the above (I) and Equations 2 and 3 for the above (II)). Furthermore, when there may be a plurality of parallel pathways other than the above process until the electrode sections (A) and (B) having the desired compositions are formed, $D_2$ and $D_4$ are interdiffusion coefficients between the electrode materials in all the pathways (for example, when the desired electrode sections (A) and (B) can be prepared by the pathways (a) and (b), they are interdiffusion coefficients between the electrode materials in the pathways (a) and (b)).

More specifically, when the electrode section (A), the electrode section (B) and the diffusion barrier region are made of $MoSi_2$, HfSi and PtSi, respectively, the constituent element A' consists of Mo and Si while the constituent element B' consists of Hf and Si. Furthermore, $D_1$ is a diffusion coefficient of Mo, Si in PtSi, and $D_3$ is a diffusion coefficient of Hf, Si in PtSi. $D_2$ is a diffusion coefficient of Si in Mo and a diffusion coefficient of Mo in Si, and $D_4$ is a diffusion coefficient of Si in Hf and a diffusion coefficient of Hf in Si.

When the electrode section (A), the electrode section (B) and the diffusion barrier region are made of $Ni_3Si$, NiSi and PtSi, respectively, the constituent elements A' and B' are Ni and Si. $D_1$ and $D_3$ are diffusion coefficients of Ni, Si in PtSi. $D_2$ is a diffusion coefficient of Si in Ni, a diffusion coefficient of Ni in Si, and a diffusion coefficient of Ni in $Ni_2Si$, NiSi which are intermediate compositions in forming $Ni_3Si$ and Si in $Ni_2S$. $D_4$ is a diffusion coefficient of Si in Ni, a diffusion coefficient of Ni in Si, and a diffusion coefficient of Si in $Ni_2Si$ which is an intermediate composition in forming NiSi.

When the electrode section (A) is made of NiSi containing B as a dopant, the electrode section (B) is made of NiSi containing As as a dopant and the diffusion barrier region is made of PtSi, the constituent element A' is Ni, Si and B, and the constituent element B' is Ni, Si and As. $D_1$ is a diffusion coefficient of Ni, Si, B in PtSi, and $D_3$ is a diffusion coefficient of Ni, Si, As in PtSi. $D_2$ is a diffusion coefficient of Si, B in Ni, a diffusion coefficient of Ni, B in B-containing Si, and a diffusion coefficient of Si, B in B-containing $Ni_2Si$ as an intermediate composition in forming B-containing NiSi. $D_4$ is a diffusion coefficient of Si, As in Ni, a diffusion coefficient of Ni, As in As-containing Si and a diffusion coefficient of Si, As in As-containing $Ni_2Si$ as an intermediate composition in forming As-containing NiSi.

In the present invention, when $D_1$ to $D_4$ are composed of a plurality of diffusion coefficients as described above, the diffusion barrier region is formed such that when comparing $D_1$ with $D_2$ and $D_3$ with $D_4$ which are diffusion coefficients where the constituent element is the same in the diffusion side, $D_1<D_2$ and $D_3<D_4$. The materials constituting the diffusion barrier region of the present invention meet at least one of the above relations, $D_1<D_2$ and $D_3<D_4$ under the possible conditions in the process such as a temperature. Thus, magnitude relations between $D_1$ and $D_2$ and between $D_3$ and $D_4$ are determined for the same constituent elements involved in diffusion (in the diffusion side).

Elements for determining magnitude relation of diffusion coefficients, $D_1$ and $D_2$, $D_3$ and $D_4$ described above are not all the constituent elements A', B' as described above, but comparison is preferably conducted only for a diffusing species (an element having the highest interdiffusion coefficient) in each step (each reaction) for forming the electrode sections (A) and (B). Since the elements other than the diffusing species has a diffusion coefficient lower than that of the element as the diffusing species, diffusion of the constituent elements A' and B' between the materials of the electrode sections (A) and (B) can be effectively prevented when diffusion coefficients of the element as the diffusing species meet the relations, $D_1<D_2$, $D_3<D_4$.

These diffusion coefficients $D_1$ to $D_4$ can be measured by a known method. For example, concentration distributions of the constituent elements A' and B' in the material in which the constituent elements A' and B' diffuse after a predetermined time are measured and diffusion coefficients can be calculated from these concentration distributions in accordance with Fick's law. For measuring concentration distributions of the constituent elements A' and B', for example, an SIMS (secondary ion mass spectrometer) can be used.

$D_1$ is preferably 0.1 fold or less, more preferably 0.07 fold or less, further preferably 0.05 fold or less, particularly preferably 0.01 fold or less of $D_2$. $D_3$ is preferably 0.1 fold or less, more preferably 0.06 fold or less, further preferably 0.04 fold or less of $D_4$ and $D_1$ is particularly preferably 0.01 fold or less of $D_2$. When there are a plurality of the constituent elements A' and B', it is preferable that $D_1$ to $D_4$ to each of the constituent elements A' and B' meet the above relationship. With diffusion coefficients within these ranges, mutual diffusion of the constituent elements A' and B' between the gate electrode materials can be more effectively prevented.

When the diffusion barrier region is formed before forming the electrode sections (A) and (B), diffusion of the constituent material of the diffusion barrier region into the electrode sections (A) and (B) side might occur. However, from the reasons described below, diffusion of the constituent material of the diffusion barrier region into the electrode sections (A) and (B) side can be prevented when at least one of the following conditions (1) and (2) of the present invention is met.

That is, when the constituent elements A' and B' of the electrode sections (A) and (B) diffuse in the diffusion barrier region, the following processes would occur.

(a) A chemical bond in a compound constituting the electrode sections (A) and (B) is cleaved, resulting in dissociation of the constituent elements A' and B'.

(b) The constituent elements A' and B' diffuse in the diffusion barrier region while cleaving a chemical bond of a compound constituting the diffusion barrier region.

On the other hand, when the constituent element A' mutually diffuses between the electrode section (A) materials and when the constituent element B' mutually diffuses between the electrode section (B) materials, the following processes would occur.

(c) A chemical bond in a compound constituting the electrode sections (A) and (B) is cleaved, resulting in dissociation of the constituent elements A' and B'.

(d) The constituent elements A' and B' diffuse in the electrode sections (A) and (B) while cleaving a chemical bond of a compound constituting the electrode sections (A) and (B).

In the present invention, at least one of the conditions (1) and (2) described below is met.

(1) A diffusion coefficient $D_1$ of the constituent element A' of the electrode section (A) in the diffusion barrier region is lower than an interdiffusion coefficient $D_2$ of the constituent element A' between the electrode section (A) materials.

(2) A diffusion coefficient $D_3$ of the constituent element B' of the electrode section (B) in the diffusion barrier region is lower than an interdiffusion coefficient $D_4$ of the constituent element B' between the electrode section (B) materials.

Here, since $D_1$ and $D_3$ are diffusion coefficients in the above processes (a) and (b), and $D_2$ and $D_4$ are diffusion coefficients in the above processes (c) and (d), meeting the relations of $D_1<D_2$ in the above (1) and of $D_3<D_4$ in the above (2) indicates that the compound constituting the diffusion barrier region has a stronger chemical bond than the compound constituting the electrode sections (A) and (B).

Diffusion of the constituent material of the diffusion barrier region into the electrode section (A) and (B) sides would proceed through the following processes.

(e) A chemical bond of a compound constituting the diffusion barrier region is cleaved, resulting in dissociation of the constituent element of the diffusion barrier region.

(f) The constituent element of the diffusion barrier region diffuses in the electrode sections (A) and (B) while cleaving a chemical bond of a compound constituting the electrode sections (A) and (B).

Here, as described above, since the compound constituting the diffusion barrier region has a stronger bond than the compound constituting the electrode sections (A) and (B), the above process (e) would be inhibited, resulting in prevention of diffusion of the constituting material of the diffusion barrier region into the electrode section (A) and (B) sides.

A length of the diffusion barrier region in an extension direction of the line electrode is preferably equal to or more than a height of the line electrode (a length in a normal direction of the semiconductor substrate) and equal to or less than a length of the isolation region in an extension direction of the line electrode. With a length of the diffusion barrier region within the range, for example, even when the electrode sections (A) and (B) and the diffusion barrier region contain a material to be a silicide, mutual diffusion of the constituent elements A' and B' does not occur between the gate electrode materials under possible conditions in the process, so that mutual diffusion of the constituent elements A' and B' can be effectively prevented. When a length of the diffusion barrier region and the isolation region in an extension direction of the line electrode varies in relation to a normal-line direction of the semiconductor substrate, it is preferable that the minimum and the maximum of this varying length meet the relation of "a length of the diffusion barrier region in an extension direction of the line electrode is equal to or more than a height of the line electrode (a length in a normal-line direction of the semiconductor substrate) and equal to or less than a length of the isolation region in an extension direction of the line electrode".

A constituent material for the diffusion barrier region must contain an element other than those for the electrode section (A) or (B). Containing an element other than those for the electrode section (A) or (B), it can more effectively prevent mutual diffusion of the constituent materials between the electrode sections (A) and (B). It is preferable to use a silicide for the diffusion barrier region. A silicide is so conductive that it can exhibit excellent diffusion preventing effect between the electrode section (A) and (B) materials.

Furthermore, the diffusion barrier region is preferably made of a silicide containing a metal element which becomes a diffusing species to polysilicon during a siliciding reaction. The term, "diffusing species" as used herein refers to an element for which when depositing a polysilicon layer and a metal layer as adjacent layers and then conducting a siliciding reaction by heating, diffusion of the metal element into polysilicon is dominant while diffusion of silicon into the metal element little occurs (it means that in mutual diffusion between silicon and the metal, an interdiffusion coefficient of the metal is larger than an interdiffusion coefficient of silicon). Thus, with the diffusion barrier region comprising a metal element as a diffusing species, it is conceivable that compositional mismatch between the metal and polysilicon and crystal fault are avoided in forming the diffusion barrier region. Thus, during forming the diffusion barrier region, a transition zone is not formed in the line electrode over the N-type region and the P-type region, so that a gate electrode having a uniform composition and excellent properties can be obtained.

The diffusion barrier region is preferably made of a silicide of at least one metal element selected from the group consisting of Pt, Pd, Co and Ni. A silicide of such an element has a high melting point and higher compositional uniformity, so that it can more effectively prevent mutual diffusion between the gate electrode materials. Thus, a gate electrode having more uniform composition and excellent properties can be provided. The diffusion barrier region may be made of a silicide of at least one element selected from the group consisting of Cr, Cu, Ir, Rh, Ti, Zr, Hf, V, Ta, Nb, Mo and W. Examples of such a silicide include $NiSi$, $Ni_2Si$, $Ni_3Si$, $NiSi_2$, $WSi_2$, $TiSi_2$, $VSi_2$, $CrSi_2$, $ZrSi_2$, $NbSi_2$, $MoSi_2$, $TaSi_2$, $CoSi$, $CoSi_2$, $PtSi$, $Pt_2Si$ and $Pd_2Si$.

Depending on the constituent materials for the first and the second gate electrodes, the first and the second gate electrodes having a uniform composition may be provided when in the process for forming a gate electrode in which a plurality of pathways may be possible or which consists of a plurality of steps, some steps meet at least one relation of $D_1 < D_2$ and $D_3 < D_4$.

Electrode Sections (A) and (B)

Electrode sections (A) and (B) mean sections in a line electrode except a diffusion barrier region, which comprise a first and a second gate electrodes having a uniform composition formed over an N-type region and a P-type region, respectively. Herein, even when the electrode sections (A) and (B) contain a dopant, they have a uniform composition if the dopant distributes uniformly in the electrode sections (A) and (B).

There are no particular restrictions to a material for the electrode sections (A) and (B) as long as it acts as a gate electrode, but preferably it is made of a silicide. The electrode sections (A) and (B) made of a silicide allows for higher conductivity and facilitation of controlling a work function.

It is preferable that the electrode sections (A) and (B) are made of a silicide containing the same elements but having different compositions. Thus, the electrode sections (A) and (B) made of a silicide different only in a composition ratio allows for further facilitation of controlling work functions in the NMOS transistor and the PMOS transistor.

Specifically, it is preferable that the electrode section (A) is made of a silicide represented by $Ni_xSi_{1-x}$ ($0.55 \leq x < 1$) crystal phase while the electrode section (B) is made of a silicide represented by $Ni_xSi_{1-x}$ ($0 < x < 0.55$) crystal phase. In such electrode sections (A) and (B), for example, the electrode section (A) may be made of $Ni_3Si$ crystal phase or $Ni_2Si$ crystal phase, and the electrode section (B) may be made of $NiSi$ crystal phase or $NiSi_2$ crystal phase.

Furthermore, it is preferable that the electrode sections (A) and (B) mutually contain dopants of different elements. In such a case, a dopant may be contained in one or both of the electrode sections (A) and (B). The electrode sections (A) and (B) may contain the same or different components other than the dopant, but preferably contain the same component. Thus, in the electrode sections (A) and (B), only the type of a dopant contained can be changed to facilitate controlling work functions of the NMOS transistor and the PMOS transistor.

For these electrode sections (A) and (B), for example, the electrode section (A) can be made of NiSi crystal phase containing B, Al or In as a dopant and the electrode section (B) can be made of NiSi crystal phase containing As or Sb.

Alternatively, the electrode sections (A) and (B) may be made of a high-melting metal silicide. The electrode sections (A) and (B) made of a high-melting metal silicide are stable at an elevated temperature, so that in a process for forming an MOS transistor conducted at a high temperature, uniformity of a composition can be stably maintained. Examples of a high-melting metal silicide may include, for example, WSi (tungsten silicide) and TaSi (tungsten silicide).

Furthermore, the electrode sections (A) and (B) and the diffusion barrier region may contain the same metal element M1. In this case, the diffusion barrier region may be made of a silicide of the metal element M1 such that a silicon becomes a diffusing species in a siliciding reaction. The term, "diffusing species" means that in mutual diffusion between silicon and the metal M1, an interdiffusion coefficient of silicon is larger than an interdiffusion coefficient of the metal M1. Specifically, the metal element M1, the electrode section (A), the electrode section (B) and the diffusion barrier region may be Ru, RuTa, Ru and a Ru silicide, respectively.

Gate Insulating Film

The gate insulating film of the present invention may be, for example, a silicon oxide film, a silicon nitride film, or a high-dielectric insulating film made of a metal oxide, a metal silicate or a nitrogen-containing metal oxide or silicate. Preferably, a high-dielectric insulating film (high-K film) is used. Thus, a high-dielectric insulating film can be combined with a silicide constituting the electrode sections (A) and (B) to control a work function through interaction between the high-dielectric insulating film and the silicide.

The term, "high-dielectric insulating film" refers to an insulating film having a relative permittivity larger than that of $SiO_2$ (for $SiO_2$, about 3.6) which is widely used as a gate insulating film in a semiconductor device. Typically, a high-dielectric insulating film may have a relative permittivity of several tens to several thousands.

Examples of a high-dielectric insulating film may include HfSiO, HfSiON, HfZrSiO, HfZrSiON, ZrSiO, ZrSiON, HfAlO, HfAlON, HfZrAlO, HfZrAlON, ZrAlO and ZrAlON.

Source/Drain Regions

The NMOS transistor and the PMOS transistor constituting a semiconductor device of the present invention comprise mutually parallel source/drain regions. The source/drain regions comprise an extension diffusion region and a source/drain diffusion region. Over the source/drain diffusion region, a silicide layer may be formed for reducing a contact resistance. A constituent material for this silicide layer may be preferably a material which is not deteriorated by heating during forming the electrode sections (A) and (B) and the diffusion barrier region.

Furthermore, preferable combinations of constituting materials for the electrode sections (A) and (B) (the first gate electrode and the second gate electrode), the diffusion barrier region and the gate insulating film in a semiconductor device of the present invention are shown in Table 1.

TABLE 1

|  | Electrode section (A) | Electrode section (B) | Diffusion barrier region | Gate insulating film |
|---|---|---|---|---|
| Semiconductor device 1 | NiSi or NiSi$_2$ | Ni$_2$Si or Ni$_3$Si | PtSi or CoSi$_2$ | HfSiON |
| Semiconductor device 2 | As-containing NiSi | B-containing NiSi | PtSi or CoSi$_2$ | SiON |
| Semiconductor device 3 | HfSi | MoSi$_2$ | CoSi$_2$ | HfSiON |
| Semiconductor device 4 | RuTa | Ru | RuSi$_x$ | SiON |

In a material combination of Ni$_3$Si or Ni$_2$Si for the electrode section (A), NiSi or NiSi$_2$ for the electrode section (B) and Pt silicide or Co silicide for the region (C), D$_1$ to D$_4$ in the constituent elements A' (Ni, Si), B' (Ni, Si) meet the conditions of D$_1$<D$_2$, D$_3$<D$_4$ under possible process conditions (conditions possible as a manufacturing process). Therefore, in a semiconductor device having this material combination, the diffusion barrier region can effectively prevent mutual diffusion between the constituent materials of the line electrode, to provide a semiconductor device comprising the electrode sections (A) and (B) (the first gate electrode, the second gate electrode) with a uniform composition and exhibiting excellent operation properties.

2. Manufacturing Process for a Semiconductor Device

A process for manufacturing a semiconductor device of the present invention comprises the steps of (1) forming and processing a gate pattern, (2) forming a diffusion barrier region, and (3) finally forming electrode sections (A) and (B). Step (1) may be one step or a combination of multiple substeps, and there are no particular restrictions to the sequence of some substeps of Step (1) (when Step (1) consists of a plurality of substeps), Step (2) and Step (3), that is, these steps may be conducted in no particular order.

A conventional process for manufacturing a semiconductor device does not contain a step corresponding to Step (2), and thus, when forming gate electrodes in an NMOS transistor and a PMOS transistor, a gate pattern over an N-type region directly contacts with a gate pattern over the P-type region. It leads to diffusion of a gate pattern constituent material from one gate pattern to the other gate pattern or between these gate patterns. Consequently, a gate electrode composition of each MOS transistor finally formed in the gate electrode formation becomes nonuniform.

However, in a process for manufacturing a semiconductor device of the present invention, a diffusion barrier region formed in Step (2) has an effect of preventing diffusion of a constituent material from one gate pattern to the other gate pattern or mutual diffusion between constituent materials in both gate patterns (diffusion of the constituent element A' between the electrode section (A) materials and diffusion of the constituent element B' between the electrode section (B) materials) in processing the gate pattern in Step (1) and in forming the electrode sections (A) and (B) in Step (3). Thus, it can prevent nonuniformity of the gate electrode constituent materials in the NMOS transistor and the PMOS transistor due to contamination of the electrode section (A) or (B) with another constituent material from electrode section.

There will be described each step in detail.

Step (1)

First, in Step (1), a gate pattern is formed and processed. Here, a gate pattern means a material initially deposited on a semiconductor substrate and the material after some treatment and processing (except the final electrode sections (A) and (B)). A constituent material of the gate pattern may be selected from various materials, depending on the constituent materials of the final electrode sections (A) and (B) and the diffusion barrier region. The gate pattern may (i) be made of a single material or (ii) consist of a plurality of regions made of different materials. The type of the gate pattern, that is, either (i) or (ii), determines the shapes of the electrode sections (A) and (B) and the diffusion barrier region as well as the subsequent manufacturing process.

When forming a gate pattern made of a single material ((i)), for example, a gate pattern made of a polysilicon layer can be formed. When forming a gate pattern constituted by a plurality of regions made of different materials ((ii)), gate pattern sections over the N-type region and the P-type region and a gate pattern section over the isolation region can be made of different materials. For example, the gate pattern sections over the N-type region and the P-type region may be made of a silicide and the section over the isolation region sandwiched by these sections may be made of polysilicon. A part of the polysilicon (gate pattern) over the N-type region and the P-type region may be reacted with another material to silicide a part (upper part) of the polysilicon over the N-type region and the P-type region while leaving the rest (lower part) as unreacted polysilicon.

The gate pattern can contain a dopant. Here, in the gate pattern, the sections over the N-type region and the P-type region suitably contain different dopants. For example, such a gate pattern is made of a polysilicon or silicide containing different dopants over the N-type region and the P-type region.

Step (2)

In Step (2), a diffusion barrier region is formed. Here, when the gate pattern formed in Step (1) is made of a single material ((i)), the shape of the diffusion barrier region depends on the conditions for forming the diffusion barrier region in Step (2). For example, in Step (2), a mask is formed on the gate patterns over the N-type region and the P-type region (partly exposing the gate pattern over the isolation region), and a material layer for the diffusion barrier region is deposited on the gate pattern formed over the isolation region. Then, by heating, the gate pattern over the isolation region is reacted with the material of the diffusion barrier region.

Here, the material of the diffusion barrier region gradually diffuses into the gate pattern and the reaction for forming the diffusion barrier region occurs within the preformed gate pattern. This reaction is substantially isotropic, so that the diffusion barrier region substantially isotropically proceeds. The reaction in a normal-line direction of the semiconductor substrate terminates at the end of reaching the gate insulating film. Here, this diffusion barrier region is preferably made of a material which prevents mutual diffusion of the constituent materials of the electrode sections (A) and (B) during forming the electrode sections (A) and (B). The diffusion barrier region has a length in an extension direction of the line electrode which prevents mutual diffusion of the constituent materials of the electrode sections (A) and (B) during forming the electrode sections (A) and (B). This reaction is adjusted to avoid formation of the diffusion barrier region over the N-type region and the P-type region. Such adjustment is possible by regulating a temperature and a time in forming the diffusion barrier region.

Then, when the gate pattern consists of three regions made of different materials over the N-type region, the P-type region and the region sandwiched by these regions ((ii)) (when the gate patterns over the N-type region and the P-type region are reacted in advance with another material in Step (1)), the shape of the diffusion barrier region is defined as the region between the preformed N-type region and P-type region. Therefore, in Step (2), a reaction in which the region sandwiched by the N-type region and the P-type region becomes the isolation region occurs.

When the gate patterns over the N-type region and the P-type region are partly made of different materials as shown in FIG. 7(d), the diffusion barrier region sandwiched by the different materials becomes the diffusion barrier region as it is, while under the region, the gate patterns over the N-type region, the P-type region and the isolation region are made of the same material. Therefore, in the lower part, the reaction isotropically proceeds as in (i). Thus, by regulating, for example, a reaction time, diffusion barrier effect can be achieved while avoiding formation of the diffusion barrier region over the N-type region and the P-type region.

Step (3)

Next, by conducting heating by Step (3), the gate pattern except the diffusion barrier region (the gate pattern sections over the N-type region and the P-type region) is reacted with another material to form the electrode sections (A) and (B). Here, in Step (3), the electrode sections can be formed simultaneously or separately.

There will be detailed each embodiment of the manufacturing process according to the present invention.

EMBODIMENT 1

Figure 4:
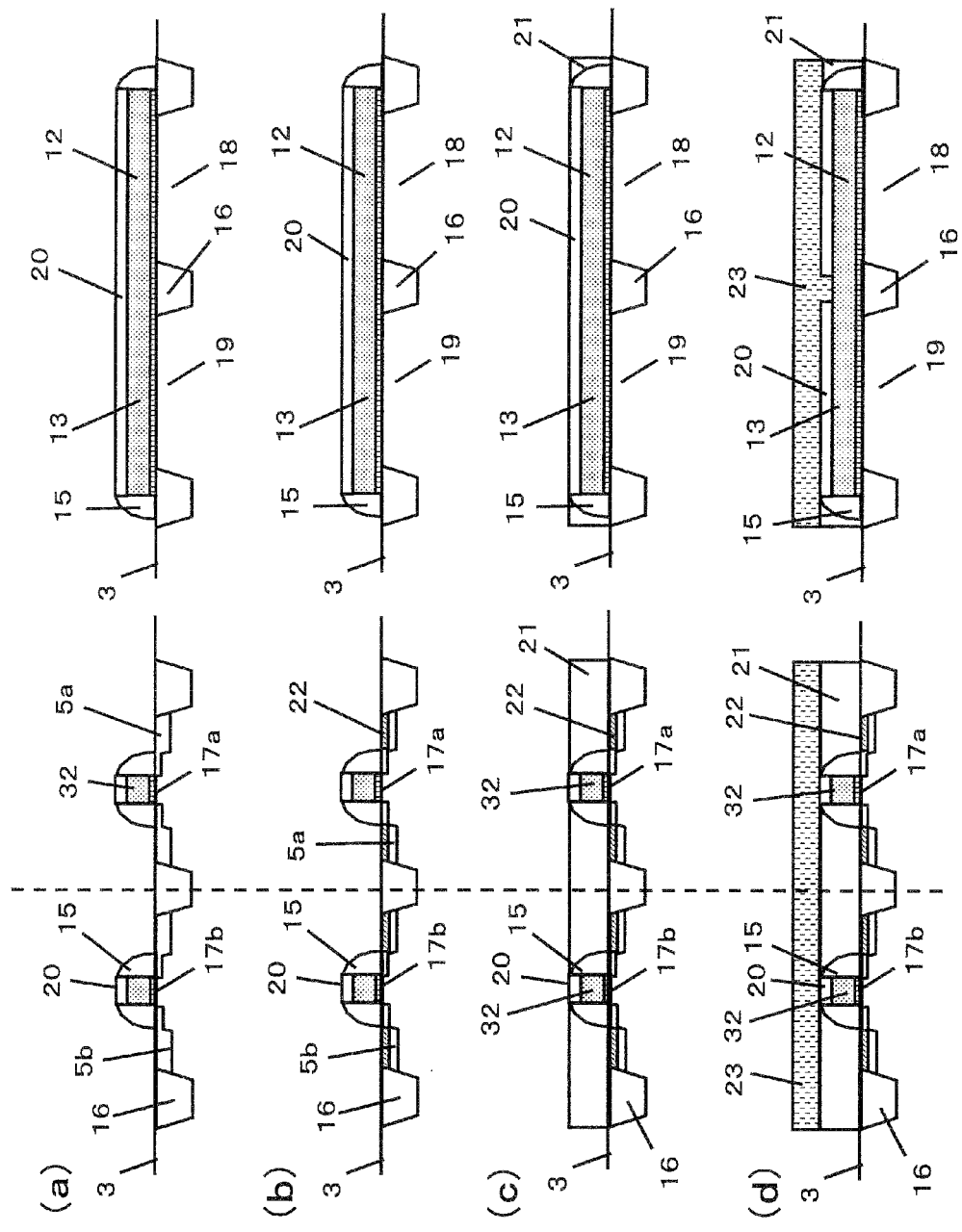
FIG. 4 shows Embodiment 1 of the manufacturing process according to the present invention.
Figure 5:
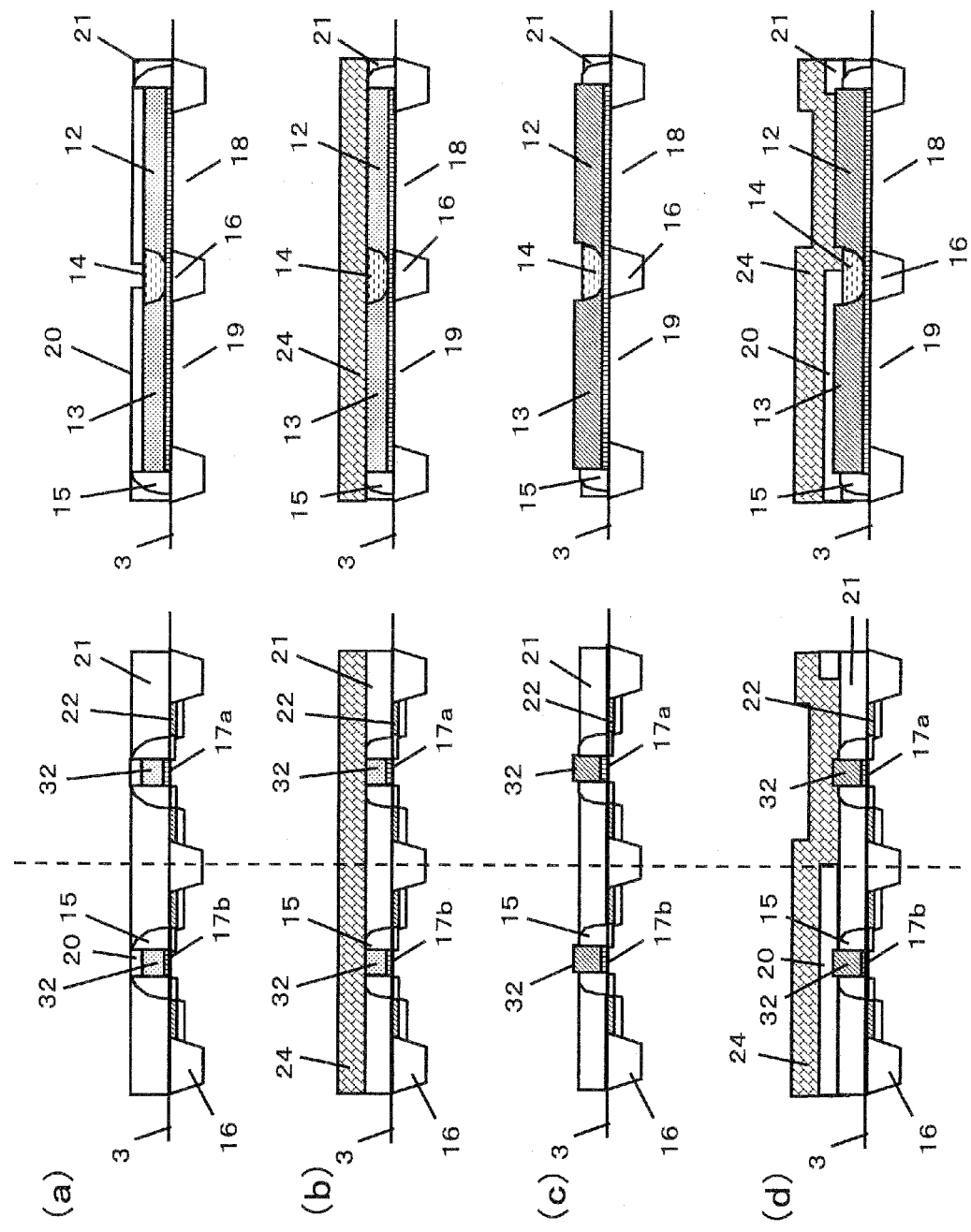
FIG. 5 shows Embodiment 1 of the manufacturing process according to the present invention.
Figure 6:
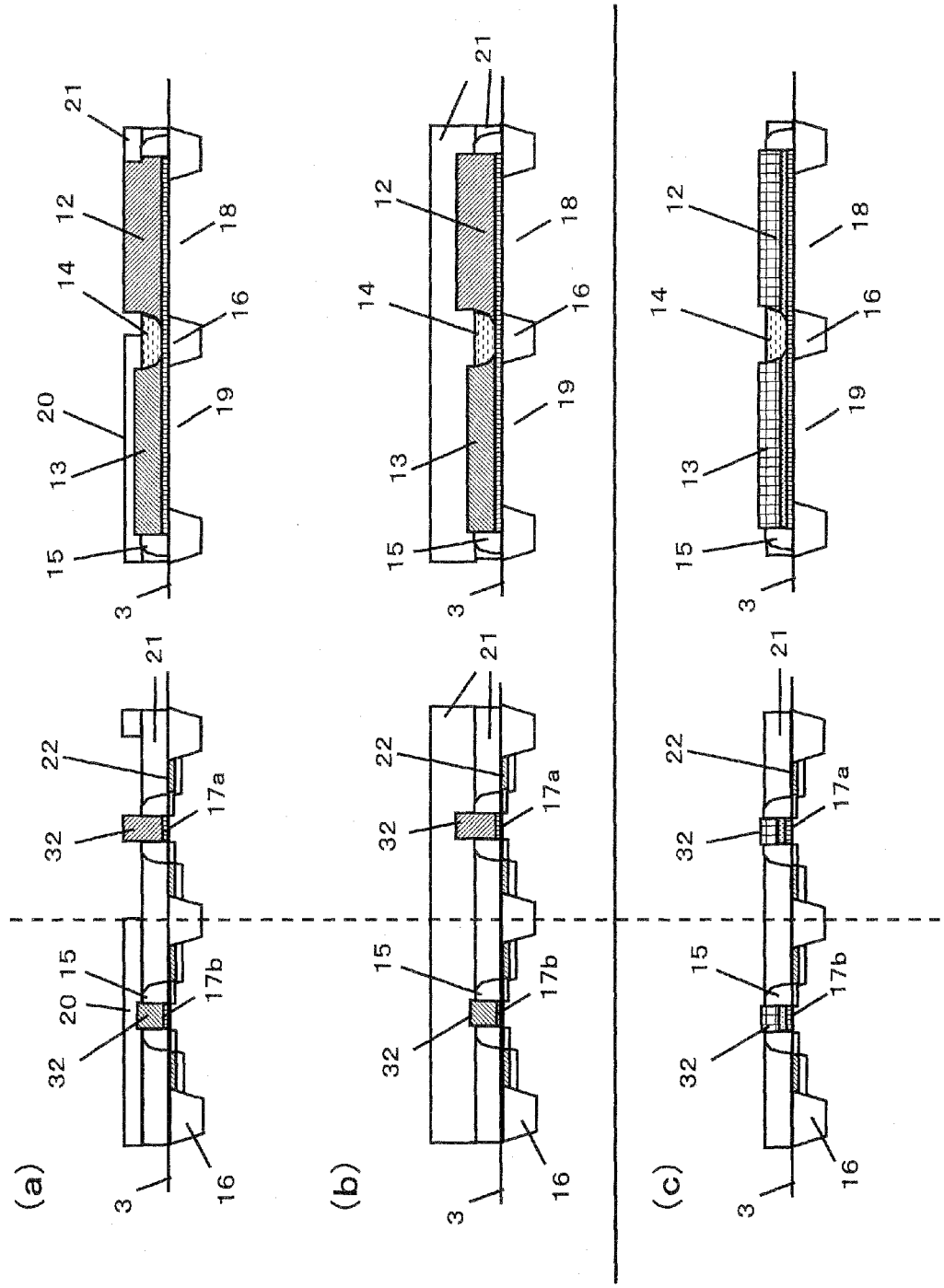
FIG. 6 shows Embodiment 1 of the manufacturing process according to the present invention.

With reference to FIGS. 4 to 6, Embodiment 1 of the present invention will be described. First, a silicon substrate 3 was prepared, which in its surface region, comprised an N-type region (N well) 18 and a P-type region (P well) 19 isolated from each other through an isolation region 16 formed by STI (Shallow Trench Isolation).

Then, a silicon oxide film was formed in the surface of the silicon substrate 3 by thermal oxidation, then a HfSiO film was deposited by MOCVD, and then the product was subjected to nitride annealing in a NH$_3$ atmosphere at 900° C. for 10 min, to provide gate insulating films 17a and 17b made of a HfSiON film with a thickness of 2 nm. The gate insulating film is not limited to a HfSiON film, and may be any of a silicon oxide film, a silicon nitride film and a high-dielectric insulating film made of a metal oxide, a metal silicate or a nitrogen-containing metal oxide or metal silicate.

Then, a polysilicon layer with a thickness of 60 nm and a silicon oxide film with a thickness of 20 nm were deposited on the gate insulating films 17a and 17b, and the product was processed by lithography and RIE (Reactive Ion Etching), to form a gate pattern 32 and a hard mask 20 made of polysilicon over the insulating film.

Next, using the gate pattern 32 as a mask, ion implantation was conducted to form an extension diffusion layer region in self-aligning manner. Then, a silicon oxide film was deposited and then etched back to form a gate sidewall 15 on the sidewall of the polysilicon layer. From this state, ion implantation was again conducted followed by activated annealing to form source/drain diffusion layers 5a, 5b (FIG. 4(a)).

Then, a metal film was deposited over the whole surface by sputtering, and a silicide layer 22 was formed only in the source/drain diffusion layers using the first semiconductor region, the gate sidewall and the STI as a mask by salicide technology (FIG. 4(b)). This silicide layer 22 was Ni monosilicide (NiSi) by which a contact resistance can be minimized. The silicide layer may be made of Co silicide Ti silicide in place of Ni silicide.

Furthermore, an interlayer insulating film 21 of a silicon oxide film was formed by CVD (Chemical Vapor Deposition). This interlayer insulating film 21 was flattened by CMP to expose a hard mask 20 (FIG. 4(c)).

Next, the hard mask over the isolation region was removed followed by deposition of a Pt film (a film of a metal M2) 23 to thickness 45 nm over the whole surface (FIG. 4(d)). The hard mask does not have to be removed in the whole region over the isolation region, but may be removed in a part of the isolation region in the light of isotropic formation of the diffusion barrier region.

Then, the polysilicon is reacted with Pt at 450° C. (a first siliciding step). At this temperature, the polysilicon reacts with Pt to autonomously form a silicide having a composition of PtSi. Thus, a diffusion barrier region 14 made of PtSi is formed within the gate pattern over the isolation region (FIG. 5(a)). This reaction temperature is preferably higher than a temperature for forming the electrode sections (A) and (B) made of Ni silicide described below, specifically 400 to 500° C.

Since this reaction isotropically proceeds, the reaction is continued until PtSi substantially reaches the gate insulating film over the isolation region, and is terminated before PtSi comes to be formed within the gate pattern section over the N-type region and the P-type region. Thus, for controlling the region within the gate pattern where the diffusion barrier region is formed, a reaction time and a temperature can be adjusted. Furthermore, this reaction must be conducted at a temperature where the silicide layer is not of a high resistance, when the silicide layer 22 is formed over the source/drain diffusion regions.

Next, the remaining Pt film 23 which had not been silicided in the above reaction (not reacted with the polysilicon) was removed by wet etching with a diluted aqua regalis. The diffusion barrier region (PtSi) is not influenced by wet etching. Then, the mask 20 formed on the polysilicon over the N-type region and the P-type region was removed by selective etching back. Then, a Ni layer 24 was deposited to thickness 40 nm by sputtering over the whole surface (FIG. 5(b)).

Subsequently, the Ni and the polysilicon (the part except the diffusion barrier region within the gate pattern; the polysilicons 12 and 13 over the N-type region and the P-type region) are reacted at 400° C. for 5 min to form NiSi (FIG. 5(C); a second siliciding step). In siliciding nickel, a composition of nickel silicide obtained varies depending on a thickness of the Ni layer deposited on the polysilicon and a siliciding temperature, and in this embodiment, a thickness of the Ni layer and a siliciding temperature are selected such that NiSi is formed. The temperature of the reaction for siliciding nickel is preferably lower than a temperature for forming the diffusion barrier region, specifically 350 to 400° C.

In this siliciding of Ni, siliciding occurs within the gate pattern sections over the N-type region and the P-type region to form NiSi because Ni is a diffusing species in relation to silicon (as for mutual diffusion between silicon and Ni, nickel has a larger diffusion coefficient than silicon). Furthermore, the diffusion barrier region has been silicided and thus does not react with nickel. Therefore, in the nickel siliciding, the whole polysilicon in the gate pattern over the N-type region and P-type region except the diffusion barrier region is converted into NiSi.

This conversion into NiSi does not have to be conducted in one step, but may be divided into two steps. In this case, first, in nickel siliciding the polysilicon except the diffusion barrier region, only the upper part of the polysilicon over the N-type region and the P-type region is reacted with Ni to form $Ni_2Si$. This $Ni_2Si$ formation can be conducted, for example, by adjusting a reaction time at 300° C.

At this stage, the unreacted polysilicon remains in the lower part of the gate pattern over the N-type region and the P-type region. In this embodiment, it is preferable that the upper two thirds of the polysilicon over the N-type region and the P-type region is converted into $Ni_2Si$ while the lower one third is left as polysilicon. Then, after removing the unreacted Ni layer, the upper $Ni_2Si$ is reacted with the lower unreacted polysilicon to convert the whole polysilicon over the N-type region and the P-type region into NiSi, independently of a gate length (FIG. 6(c)). Here, a small amount of residual $Ni_2Si$ which has not reacted with the polysilicon may be acceptable.

Then, after removing the remaining Ni layer which had not reacted with the polysilicon over the N-type region and the P-type region, a mask 20 consisting of an oxide film with a thickness of 20 nm was formed on the NiSi region 13 over the P-type region 19. Then, a Ni layer 24 was deposited to thickness 80 nm by sputtering (FIG. 5(d)). Then, the NiSi region 12 over the N-type region was reacted with Ni layer 24 at 400° C. for 5 min to convert the whole NiSi over the N-type region into $Ni_3Si$ (a second siliciding step). Since the nickel silicide does not have a nickel-rich phase any more, a uniform $Ni_3Si$ can be obtained, independently of a gate length. Here, a thickness of the Ni layer 24 and a reaction temperature were set to those where a silicide having a composition of $Ni_3Si$ is autonomously formed from NiSi. Then, the excessive Ni layer 24 which had remained without reacting was removed (FIG. 6(a)). Next, after removing the mask formed on the NiSi region 13 over the P-type region, an interlayer insulating film 21 can be formed over the whole surface to form a semiconductor device of the present invention (FIG. 6(b)).

In the initial siliciding (NiSi formation) after forming the diffusion barrier region, the gate pattern section over the P-type region becomes a NiSi crystal phase to form an electrode section (B) (a second gate electrode). In the second siliciding (formation of a $Ni_3Si$ crystal phase from a NiSi crystal phase), the gate pattern section over the P-type region becomes a $Ni_3Si$ crystal phase to form an electrode section (A) (a first gate electrode).

In the semiconductor device prepared in this embodiment, the constituent elements A' and B' are Ni and Si, and the materials for the electrode sections (A) and (B) are Ni, Si, NiSi and $Ni_2Si$. $D_1$ and $D_3$ are, therefore, diffusion coefficients of Ni and Si in PtSi. Furthermore, $D_2$ is a diffusion coefficient of Si in Ni, Ni in Si, Ni in NiSi, Ni in $Ni_2Si$ and Si in $Ni_2Si$, and $D_4$ is a diffusion coefficient of Si in Ni, Ni in Si and Si in $Ni_2Si$. Under the process conditions of this embodiment, any of Ni and Si meets the conditions of $D_1<D_2$ and $D_3<D_4$. Therefore, at the time of these siliciding steps, the diffusion barrier region has been already formed, so that mutual diffusion between the constituent materials in the gate pattern sections separated by the diffusion barrier region is prevented. Furthermore, since the material constituting the diffusion barrier region formed before forming the electrode sections (A) and (B) has a very small diffusion coefficient in the diffusion barrier region, the constituent material of the diffusion barrier region does not diffuse into the electrode sections (A) and (B).

Thus, the initially formed electrode section (B) and the secondly formed electrode section (A) have an uniform composition, resulting in avoiding deviation in a work function.

As a result, there can be provided a semiconductor device in which a $V_{th}$ is effectively controlled and which has excellent operation properties.

Although in this embodiment NiSi was formed in the first siliciding and $Ni_3Si$ was formed in the second siliciding, $NiSi_2$ may be formed. When forming $NiSi_2$, it is, for example, formed through two steps. Here, first, in converting the polysilicon except the diffusion barrier region into nickel silicide, only the upper part of the polysilicon over the N-type region and the P-type region is reacted with Ni to form $Ni_2Si$. This conversion into $Ni_2Si$ can be conducted, for example, by the reaction under an $N_2$ atmosphere at 280° C. for 5 min. Here, since the unreacted polysilicon remains in the lower parts of the gate pattern sections over the N-type region and the P-type region, the upper $Ni_2Si$ can be, after removing the unreacted Ni layer, reacted with the lower unreacted polysilicon to convert the whole polysilicon over the N-type region and the P-type region into $Ni_2Si$, independently of a gate length. This reaction can be conducted, for example, by treatment under an $N_2$ atmosphere at 650° C. for 2 min.

EMBODIMENT 2

Figure 13:
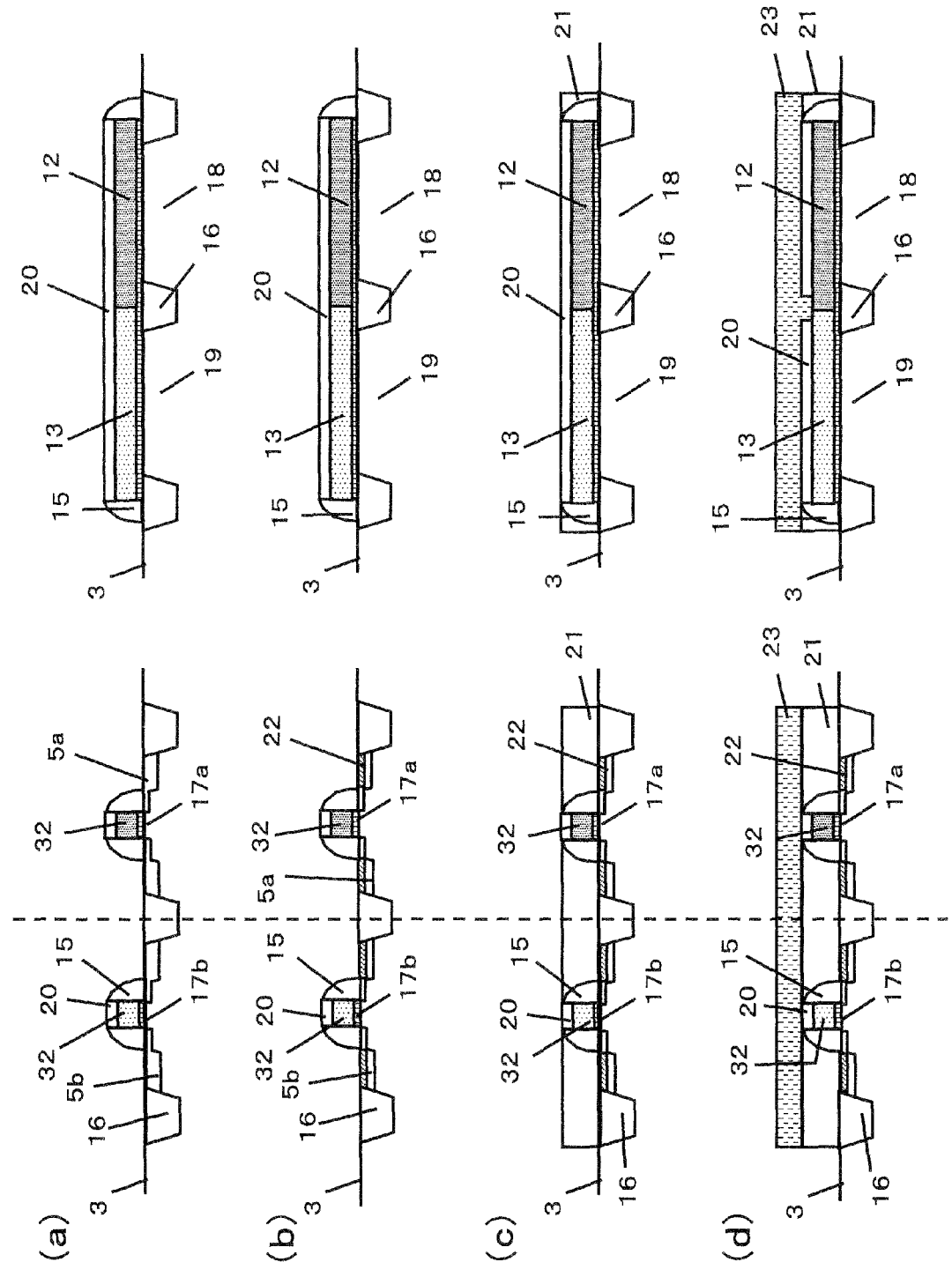
FIG. 13 shows Embodiment 4 of the manufacturing process according to the present invention.
Figure 14:
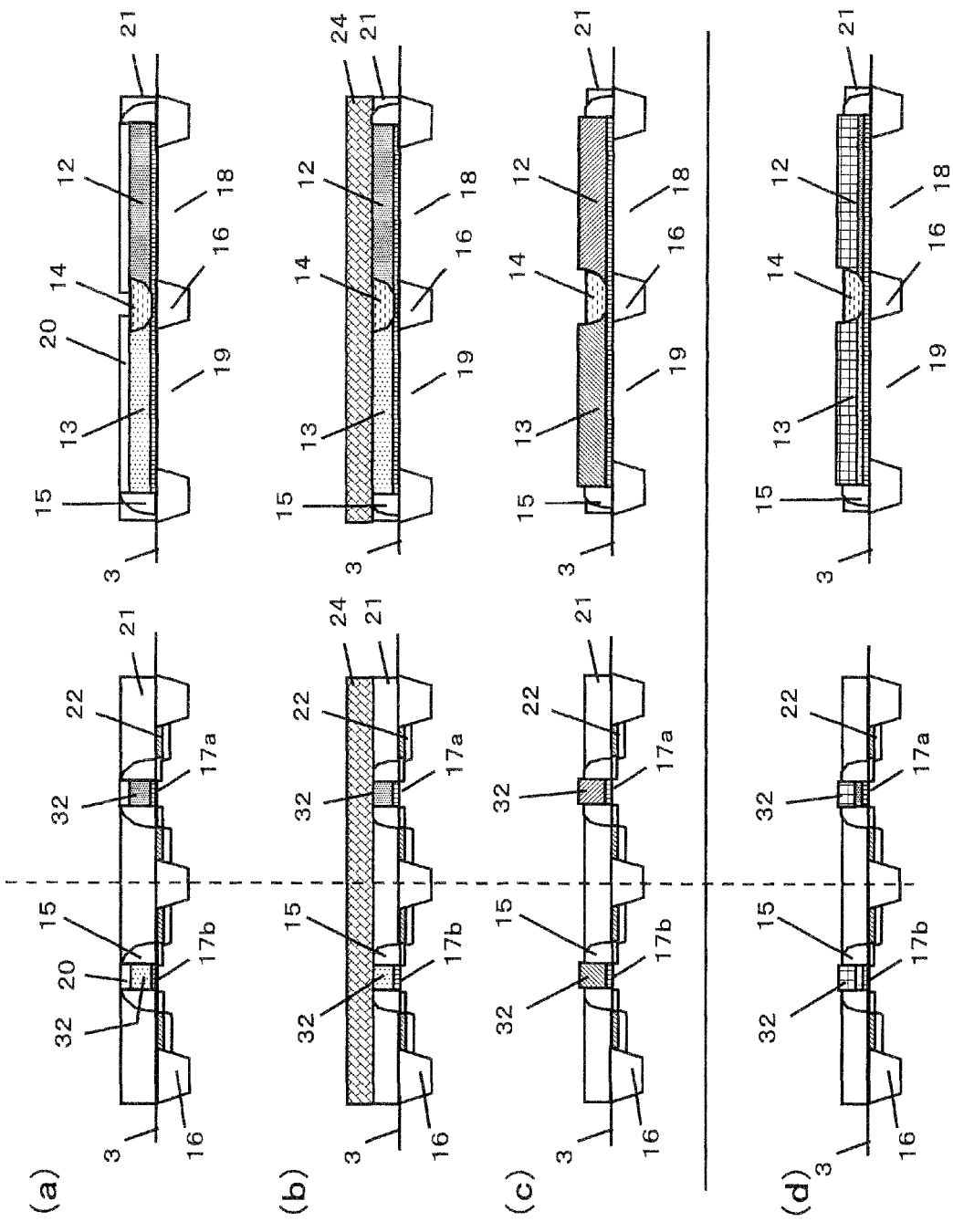
FIG. 14 shows Embodiment 4 of the manufacturing process according to the present invention.

Embodiment 2 of the present invention will be described with reference to FIGS. 13 and 14. Embodiment 2 of the present invention is a variation of Embodiment 1 and different from Embodiment 1 in that preformed polysilicon as a gate pattern contains different types (elements) of dopants over the N-type region and the P-type region and in that a gate insulating film is made of $SiO_2$. A dopant contained in polysilicon over the N-type region is preferably B, Al or In, and a dopant contained in polysilicon over the P-type region is preferably P, As or Sb. In this embodiment, there was formed polysilicon containing As in $4 \times 10^{-15}$ $cm^{-2}$ over the P-type region and B in $4 \times 10^{-15}$ $cm^{-2}$ over the N-type region.

The other steps are conducted as described in Embodiment 1 to form an N-type region, a P-type region, a polysilicon layer, a gate insulating film, a hard mask, a gate sidewall and source/drain regions (FIG. 13(a)), and then to form an NiSi layer over the source/drain regions (FIG. 13(b)). Then, an interlayer insulating film 21 is formed, and a hard mask 20 is exposed (FIG. 13(c)).

Next, after partly removing the hard mask 20 over the isolation region, a Pt layer 23 is deposited to thickness 45 nm over the whole surface (FIG. 13(d)). Then, the polysilicon is reacted with Pt to form a diffusion barrier region 14 made of PtSi (FIG. 14(a); a first siliciding step). Then, after removing Pt unreacted with the polysilicon, the masks on the polysilicon over the N-type region and the P-type region are removed. Next, an Ni layer 24 is deposited to thickness 40 nm over the whole surface by sputtering (FIG. 14(b)), and then the polysilicon is reacted with Ni to convert the whole polysilicon into NiSi (FIG. 14(c); a second siliciding step). Here, a thickness of the Ni layer 24 and a siliciding temperature are set to those where the whole polysilicon is converted into NiSi. Then, the Ni layer unreacted with the polysilicon is removed and an interlayer insulating film is formed to provide a semiconductor device of the present invention.

As described in Embodiment 1, this conversion of the polysilicon into NiSi may be conducted by two steps of partly converting the upper part of the polysilicon into $Ni_2Si$ in advance and then reacting $Ni_2Si$ with the lower unreacted polysilicon (FIG. 14(d)).

In the semiconductor device of this embodiment, the constituent elements A' and B' are Ni, Si, As and B, and the materials for the electrode sections (A) and (B) are Ni, Si, As-containing Si, B-containing Si, As-containing $Ni_2Si$ and B-containing Ni$_2$Si. Therefore, D$_1$ is a diffusion coefficient of Ni, Si, B in PtSi, and D$_3$ is a diffusion coefficient of Ni, Si, As in PtSi. Furthermore, D$_2$ is a diffusion coefficient of Si and B in Ni, Ni, B in B-containing Si and Si, B in B-containing Ni$_2$Si, and D$_4$ is a diffusion coefficient of Si and As in Ni, Ni, As in As-containing Si and Si, As in As-containing Ni$_2$Si. Under the process conditions of this embodiment, any of Ni, Si, As, B meets the conditions of D$_1$<D$_2$ and D$_3$<D$_4$.

In the initial siliciding step (NiSi formation) after forming the diffusion barrier region, electrode sections (A) and (B) (a first gate electrode and a second gate electrode) made of NiSi crystal phases containing mutually different dopants are formed on the sides of the diffusion barrier region. When the gate pattern is made of polysilicon but contains a dopant different between the N-type region and the P-type region, a dopant diffuses over one region during the siliciding step if the diffusion barrier region is absent. However, in this embodiment, in advance, a diffusion barrier region is preformed over the isolation region. Furthermore, since the material constituting the diffusion barrier region formed before forming the electrode sections (A) and (B) has a very small diffusion coefficient in the diffusion barrier region, the constituent material of the diffusion barrier region does not diffuse into the electrode sections (A) and (B). A semiconductor device can be, therefore, provided, in which a dopant does not diffuse from one region to the other region during the siliciding step, deviation of a work function does not occur, V$_{th}$ is effectively controlled and excellent operation properties are obtained.

EMBODIMENT 3

Figure 17:
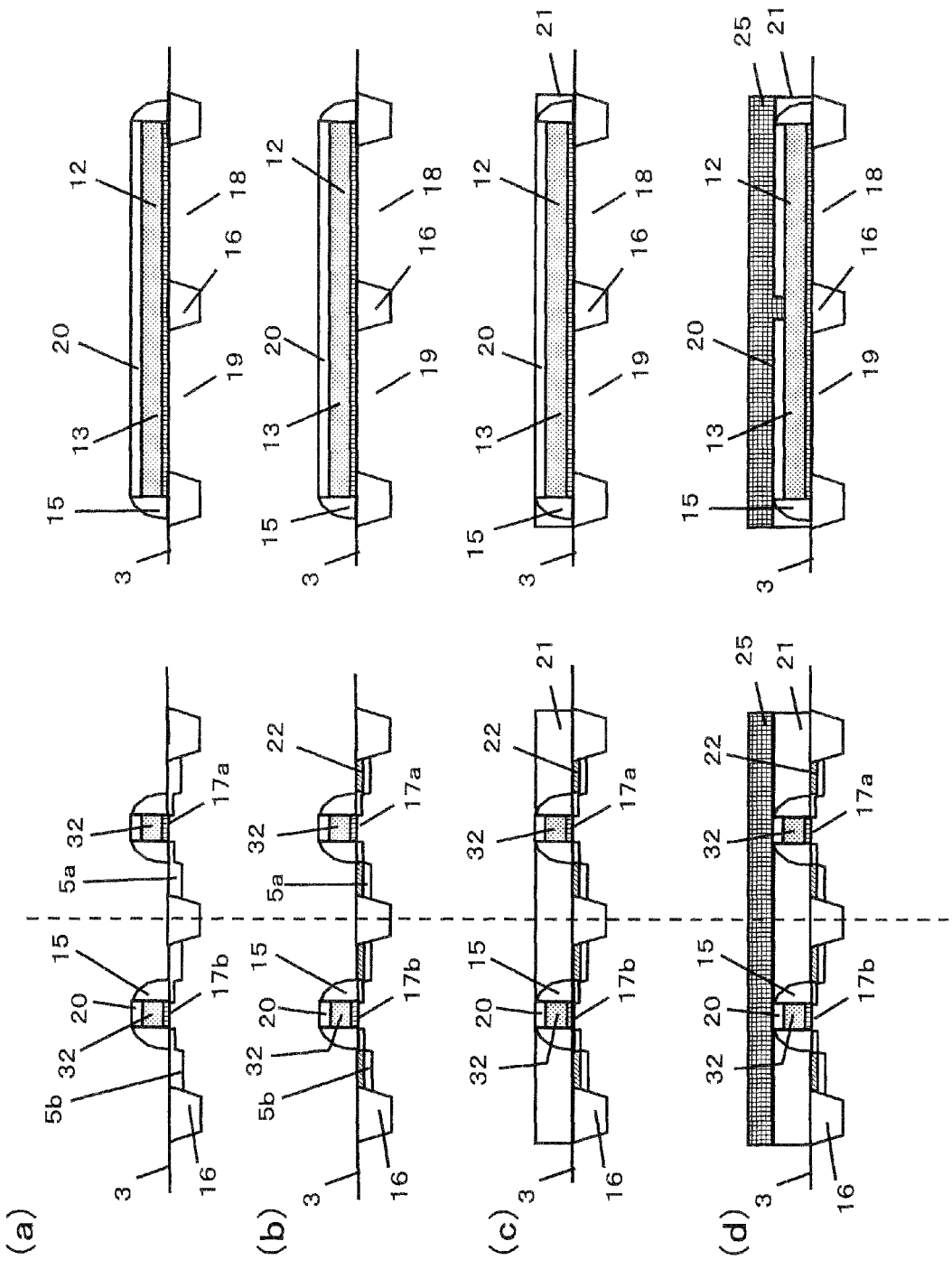
FIG. 17 shows Embodiment 6 of the manufacturing process according to the present invention.
Figure 18:
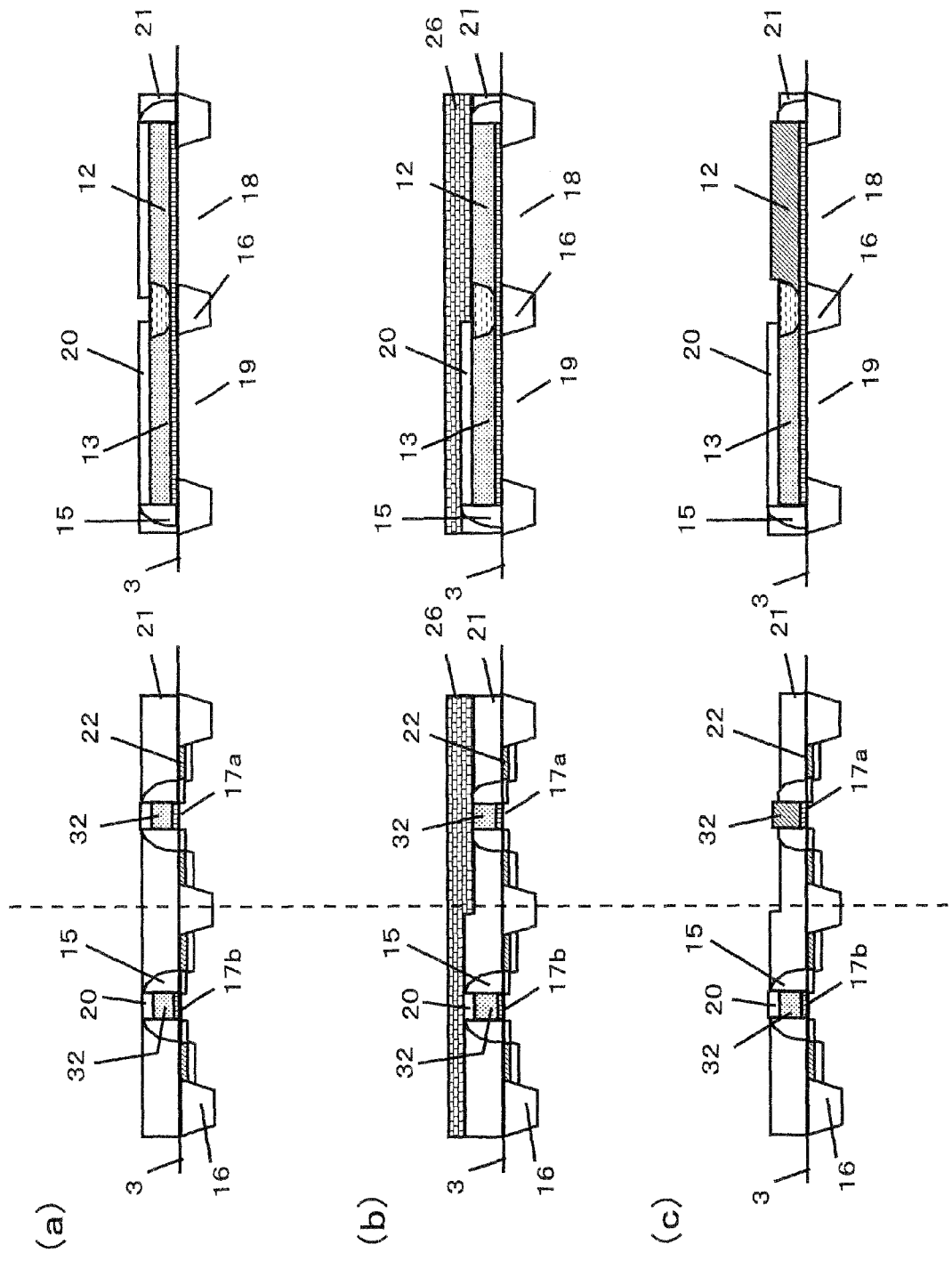
FIG. 18 shows Embodiment 6 of the manufacturing process according to the present invention.
Figure 19:
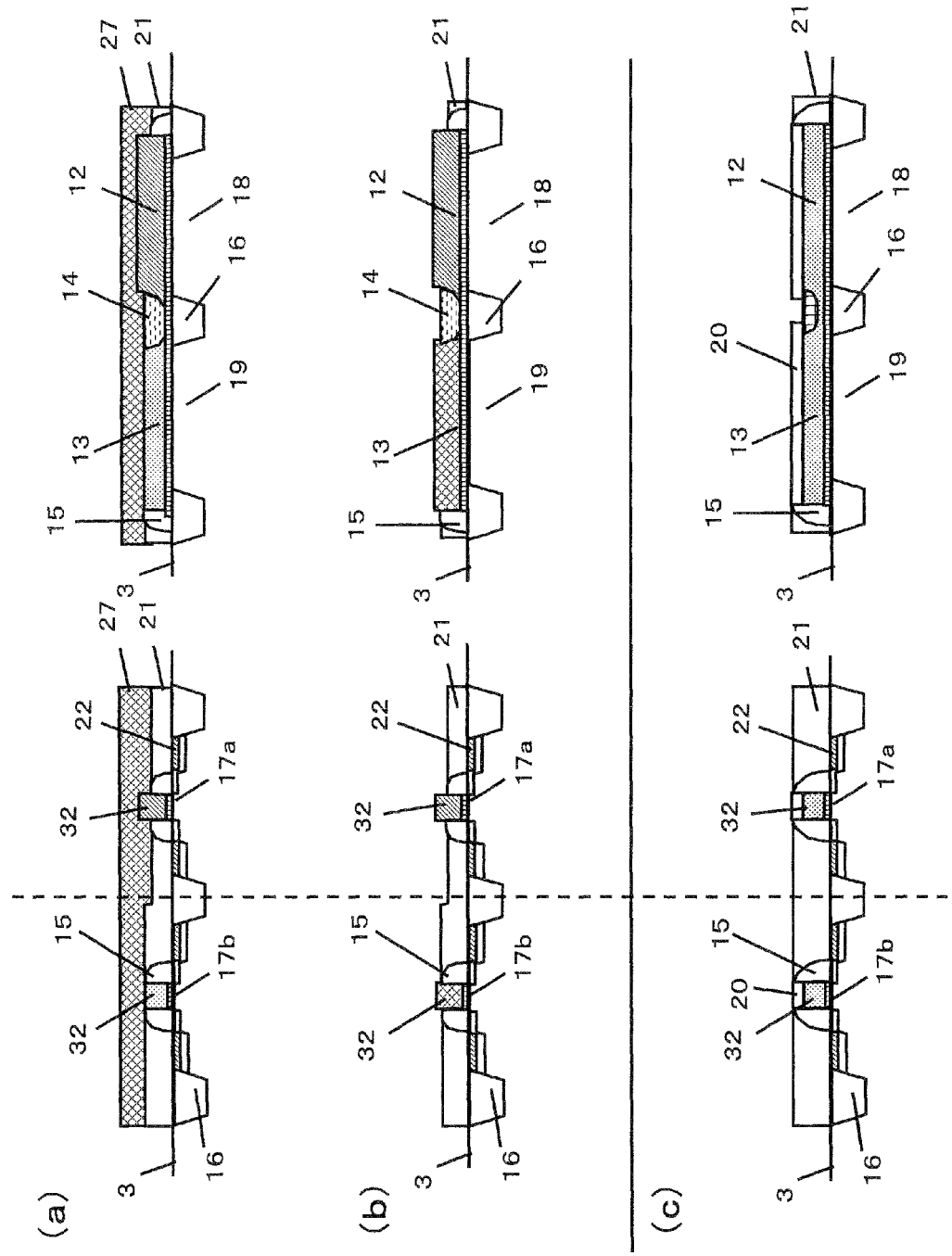
FIG. 19 shows Embodiment 6 of the manufacturing process according to the present invention.

Embodiment 3 of the present invention will be described with reference to FIGS. 17 to 19. Embodiment 3 of the present invention is a variation of Embodiment 1, different from Embodiment 1 in that a silicide and diffusion barrier region over source/drain regions are made of CoSi$_2$ and that electrode sections (A) and (B) (a first gate electrode and a second gate electrode) are made of MoSi$_2$ and HfSi, respectively.

The other steps are conducted as described in Embodiment 1, to form an N-type region, a P-type region, a polysilicon layer, a gate insulating film, a hard mask, a gate sidewall and source/drain regions (FIG. 17(a)), and then to form a CoSi$_2$ layer 22 over the source/drain regions (FIG. 17(b)). Then, after forming an interlayer insulating film 21, the hard mask 20 is exposed (FIG. 17(c)). Next, after partly removing the hard mask 20 over the isolation region, a Co layer (a metal M2 layer) 25 is deposited to thickness 20 nm over the whole surface (FIG. 17(d)). Then, the polysilicon is reacted with Co at 600° C. to form a diffusion barrier region 14 made of CoSi$_2$ (FIG. 18(a); a first siliciding step).

This reaction isotropically occurs, Furthermore, the Co-siliciding reaction mainly occurs within the gate pattern because Co is a diffusing species to silicon. Thus, the reaction is continued until CoSi$_2$ substantially reaches the gate insulating film over the isolation region and is terminated before CoSi$_2$ is formed within the gate pattern over the N-type region and the P-type region. Thus, for controlling a region where a diffusion barrier region is formed within the gate pattern, a reaction time and a reaction temperature may be adjusted.

This conversion into CoSi$_2$ of polysilicon does not have to be conducted in one step, but may be divided into two steps. In this case, first, only the upper part of the polysilicon over the isolation region is reacted with Si at 400° C. to form CoSi (FIG. 19(c)). Next, this CoSi can be reacted with the unreacted polysilicon at 600° C. to form CoSi$_2$. Thus, whether CoSi or CoSi$_2$ is obtained can be controlled by adjusting, for example, a reaction temperature.

Although the Co-siliciding reaction occurs at a high temperature, CoSi$_2$ is also formed over the source/drain regions in this embodiment, so that the silicide layer over the source/drain regions is not deteriorated during forming the diffusion barrier region.

Next, after removing the Co unreacted with the polysilicon, the mask 20 formed on the polysilicon 12 over the N-type region is removed. Then, a Mo layer 26 is deposited to thickness 25 nm over the whole surface by sputtering (FIG. 18(b)). Then, the polysilicon 12 over the N-type region is reacted with Mo to convert the whole polysilicon 12 over the N-type region into MoSi$_2$ (FIG. 18(c); a second siliciding step). This siliciding step can be typically conducted at 600° C., preferably 500 to 700° C.

Subsequently, after removing the Mo layer 26 unreacted with the polysilicon, the mask 20 formed on the polysilicon 12 over the P-type region is removed by etching back. Then, a Hf layer 27 is deposited to thickness 70 nm over the whole surface by sputtering (FIG. 19(a)). Next, the polysilicon 13 is reacted with Hf to convert the whole polysilicon 13 over the P-type region into HfSi (FIG. 19(b); a second siliciding step). This siliciding step can be typically conducted at 600° C., preferably 550 to 650° C. Subsequently, the Hf layer 27 unreacted with the polysilicon 13 is removed and further an interlayer insulating film can be formed to provide a semiconductor device of the present invention.

In this embodiment, the electrode section (A) (the first gate electrode) is formed in the initial siliciding after forming the diffusion barrier region (at the time of forming the MoSi$_2$ crystal phase), and the electrode section (B) (the second gate electrode) is formed in the second siliciding (at the time of forming the HfSi crystal phase). During the initial siliciding (MoSi$_2$ formation), the gate pattern (polysilicon) 13 over the P-type region is separated from the Mo layer 26 and the gate pattern 12 over the N-type region through the diffusion barrier region 14 and the mask 20.

In the semiconductor device prepared in this embodiment, the constituent elements A' and B' are Mo, Si and Hf, and the material for the electrode sections (A) and (B) are Mo, Si and Hf. Therefore, D$_1$ is a diffusion coefficient of Mo, Si in CoSi$_2$, and D$_3$ is a diffusion coefficient of Hf, Si in CoSi$_2$. D$_2$ is a diffusion coefficient of Si in Mo and Mo in Si, and D$_4$ is a diffusion coefficient of Si in Hf and Hf in Si. Under the process conditions of this embodiment, any of Mo, Si and Hf meets the conditions of D$_1$<D$_2$ and D$_3$<D$_4$.

Therefore, mutual diffusion between the gate electrode materials is prevented during the siliciding (heating). During the initial siliciding (MoSi$_2$), the gate pattern section (polysilicon) over the P-type region is separated from the electrode section (A) (the first gate electrode) through the diffusion barrier region. Furthermore, since the material constituting the diffusion barrier region formed before forming the electrode sections (A) and (B) has a very small diffusion coefficient in the diffusion barrier region, the material constituting of the diffusion barrier region does not diffuse into the electrode sections (A) and (B). Thus, a gate electrode having a uniform composition can be obtained without mutual diffusion of the gate electrode materials during siliciding (heating). As a result, a semiconductor device can be prepared, in which deviation of a work function is prevented, a V$_{th}$ is effectively controlled and excellent operation properties are obtained.

EMBODIMENT 4

Figure 7:
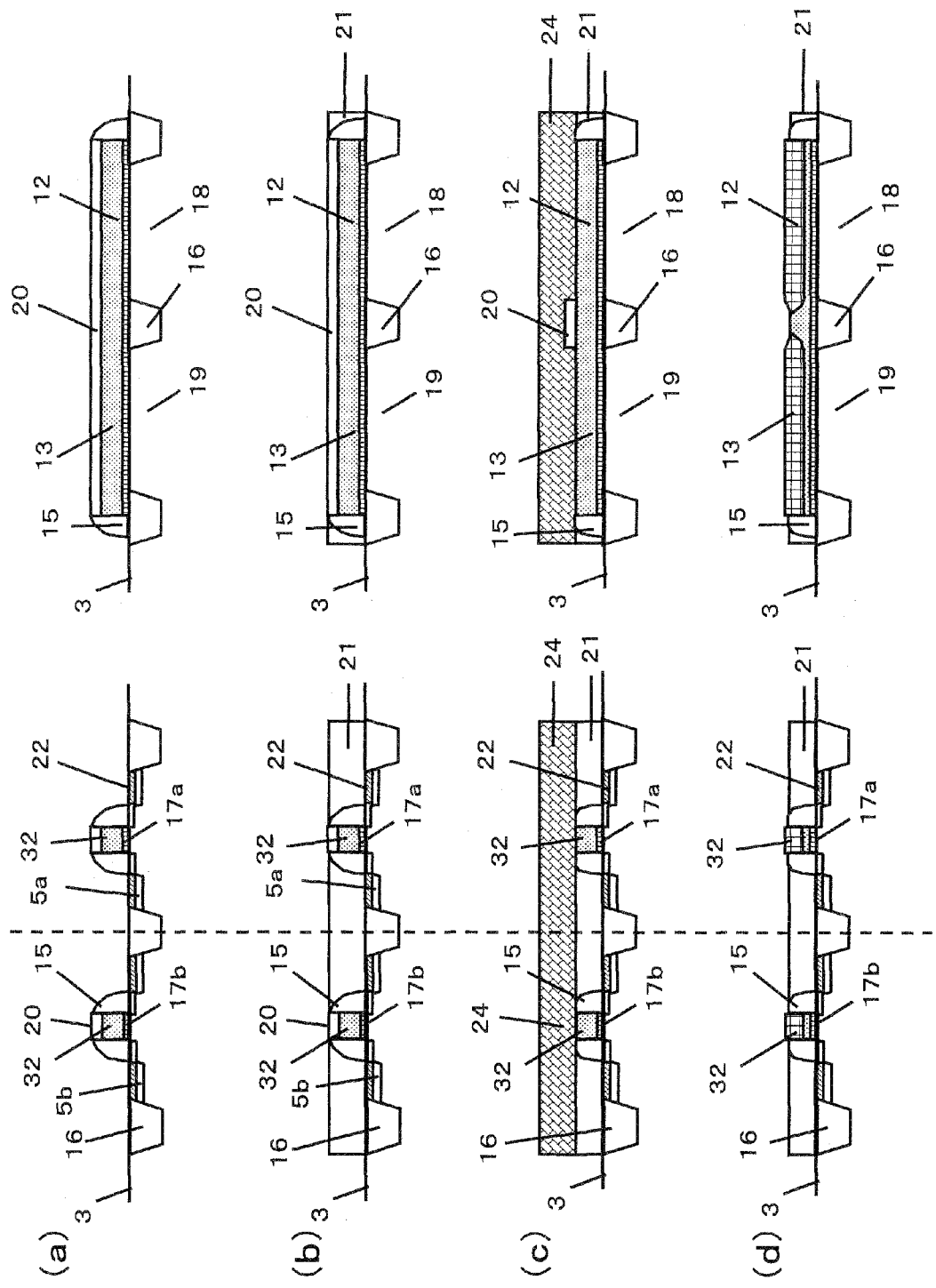
FIG. 7 shows Embodiment 2 of the manufacturing process according to the present invention.

Embodiment 4 of the present invention will be described with reference to FIGS. 7 to 9. This embodiment is a different type of embodiment from Embodiment 1; specifically different from Embodiment 1 in that a silicide is preformed in the gate pattern sections 12 and 13 over the N-type region and the P-type region before forming a diffusion barrier region. In this embodiment, first, an N-type region, a P-type region, a polysilicon layer, a gate insulating film, a hard mask, a gate sidewall and source/drain regions are formed as described in Embodiment 1 (FIG. 7(*a*)), and then a NiSi layer 22 is formed over the source/drain regions. Then, after forming an interlayer insulating film 21, the hard mask 20 is exposed by CMP (FIG. 7(*b*)). Then, the hard mask except the section over the isolation region is selectively etched back to expose the polysilicon regions (the gate pattern) over the N-type region and the P-type region, and then a Ni layer (a metal M3 layer) 24 is deposited (FIG. 7(*c*)).

Subsequently, the polysilicons 12 and 13 over the N-type region and the P-type region are partly reacted with Ni at 300° C., to convert a part (the upper part) over the N-type region and the P-type region into Ni$_2$Si (a third siliciding step). At this time, unreacted polysilicon remains in the lower parts of the gate pattern sections 12 and 13 over the N-type region and the P-type region. In this embodiment, the upper two thirds of the polysilicons 12 and 13 over the N-type region and the P-type region are made of Ni$_2$Si while the lower one third is made of polysilicon. Here, the polysilicon under the hard mask 20 does not react with nickel. Next, after removing Ni unreacted in the above siliciding reaction, the hard mask 20 on the isolation region is removed (FIG. 7(*d*)).

Figure 8:
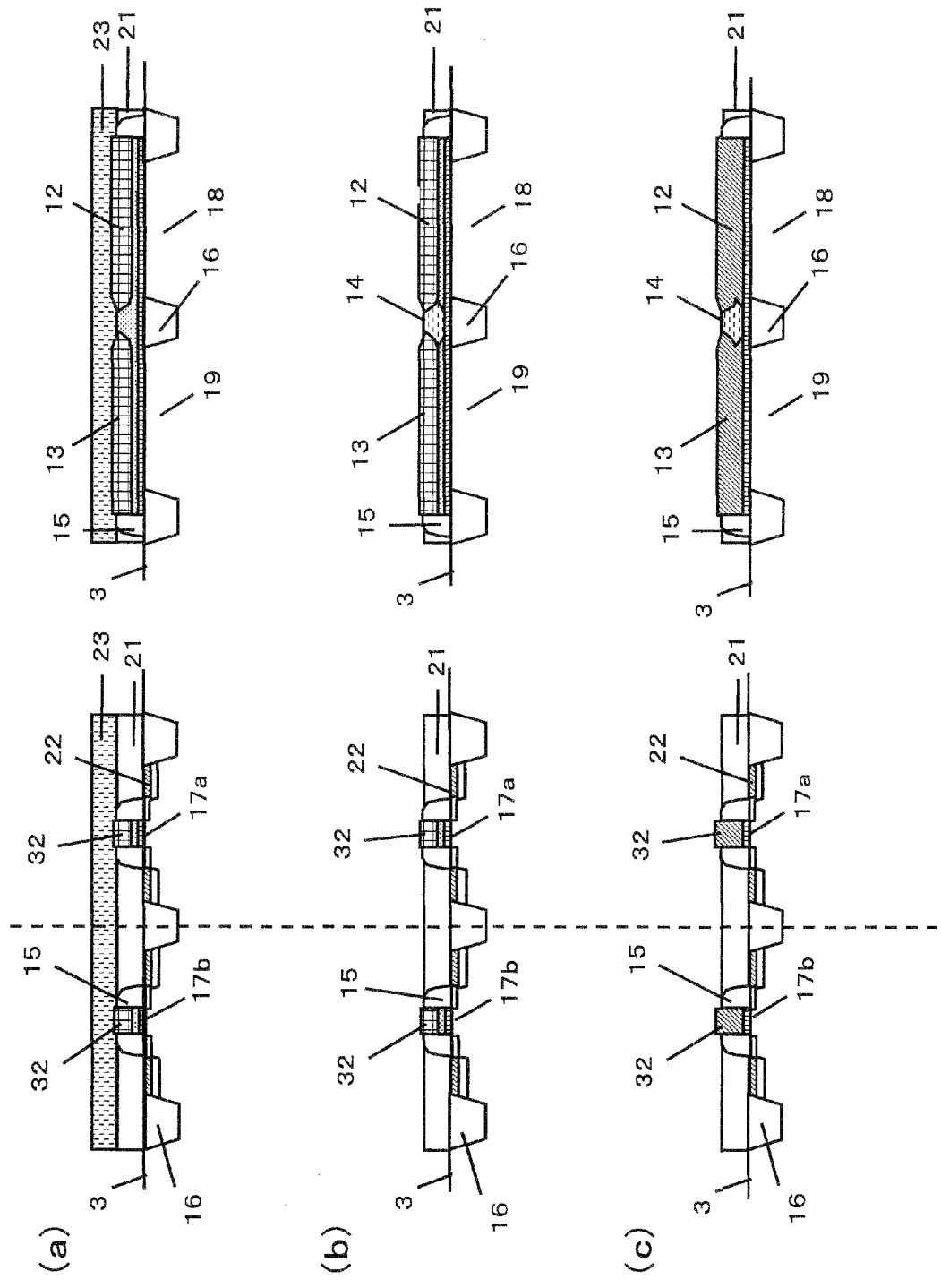
FIG. 8 shows Embodiment 2 of the manufacturing process according to the present invention.

Then, a Pt layer (a metal M4 layer) 23 is deposited over the whole surface (FIG. 8(*a*)). Next, the Pt is reacted with the polysilicon over the isolation region at 300° C., to form a diffusion barrier region 14 made of PtSi (a fourth siliciding step). Here, the Ni$_2$Si section of the gate pattern except the diffusion barrier region has been already silicided and thus does not react with Pt at 300° C. Then, the Pt unreacted with the polysilicon in the above siliciding reaction is removed by wet etching (FIG. 8(*b*)).

Subsequently, the Ni$_2$Si over the N-type region and the P-type region which has been formed before formation of the diffusion barrier region is reacted with the remaining polysilicon under the Ni$_2$Si at 400° C. to form NiSi (FIG. 8(*c*); a fifth siliciding step). Here, a small amount of residual Ni$_2$Si may be acceptable in the upper part of the gate pattern.

Figure 9:
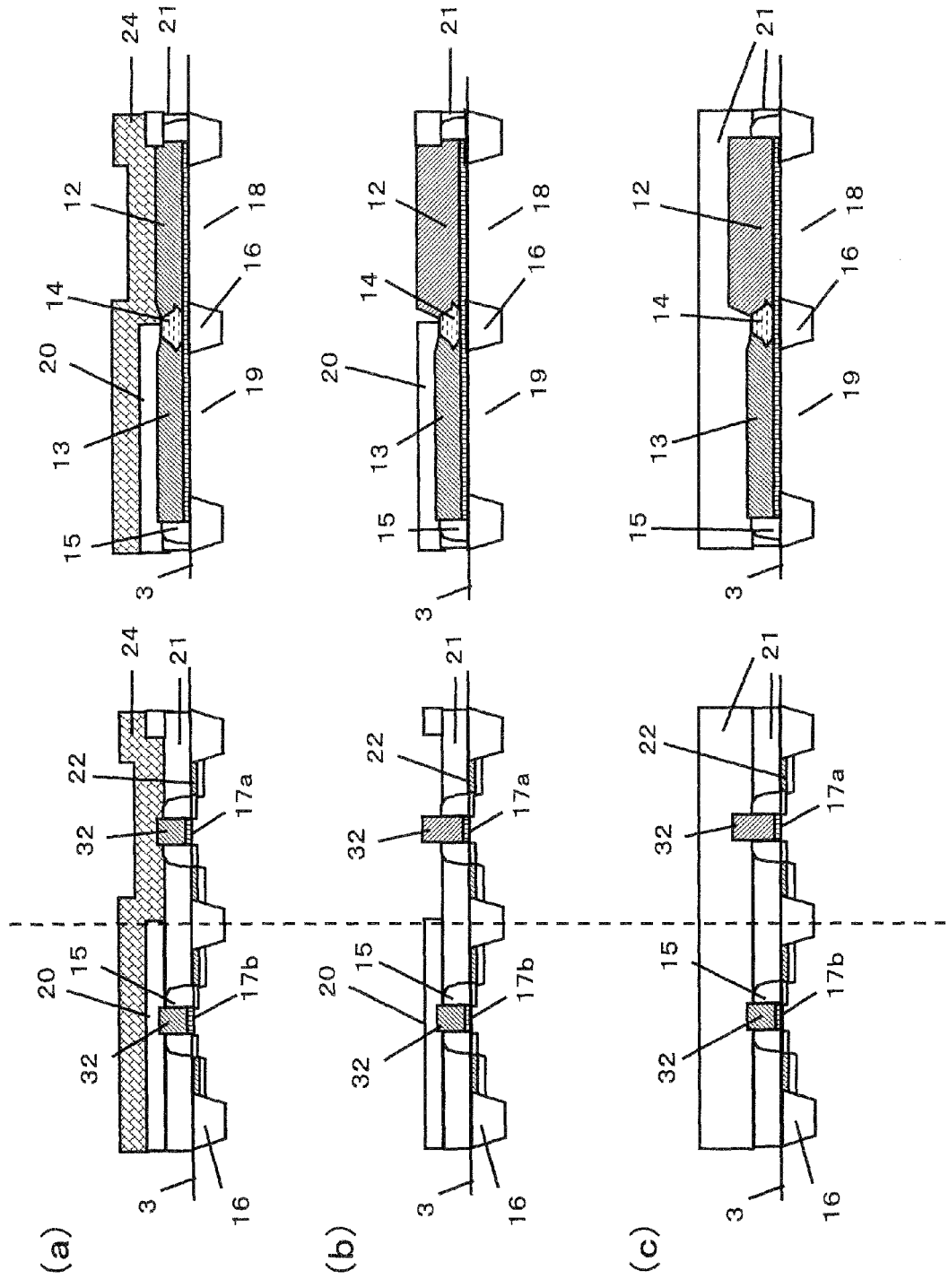
FIG. 9 shows Embodiment 2 of the manufacturing process according to the present invention.

Then, as described in Embodiment 1, a mask 20 is formed on the NiSi region 13 over the P-type region, and then a Ni layer 24 is deposited (FIG. 9(*a*)). Furthermore, the Ni is reacted with the NiSi 12 over the N-type region to form Ni$_3$Si (a fifth siliciding step). Then, after removing the Ni layer unreacted with the NiSi 12 (FIG. 9(*b*)), the mask 20 formed on the gate pattern section 13 over the P-type region is removed and an interlayer insulating film 21 is formed to provide a semiconductor device of the present invention (FIG. 9(*c*)).

In this embodiment, in the initial siliciding step after forming the diffusion barrier region (NiSi formation), the gate pattern over the P-type region becomes a NiSi crystal phase and the electrode section (B) (the second gate electrode) is formed. In the second siliciding step (formation of a Ni$_3$Si crystal phase from a NiSi crystal phase), the gate pattern over the N-type region becomes a Ni$_3$Si crystal phase and the electrode section (A) (the first gate electrode) is formed. In this embodiment, the constituent elements A' and B', the materials for the electrode sections (A) and (B) as well as the diffusion coefficients $D_1$ to $D_4$ are as described for Embodiment 1. Here, since the diffusion barrier region has been already formed, mutual diffusion between the materials constituting the gate pattern sections separated by the diffusion barrier region is prevented by the diffusion barrier region. Furthermore, since the material constituting the diffusion barrier region has a very small diffusion coefficient in the diffusion barrier region, it does not diffuse into the electrode section (A) and (B). Thus, the initially formed electrode section (B) and the secondly formed electrode section (A) have an uniform composition, resulting in avoiding deviation in a work function. As a result, there can be provided a semiconductor device in which a $V_{th}$ is effectively controlled and which has excellent operation properties.

EMBODIMENT 5

Embodiment 5 of the present invention will be described with reference to FIGS. 10 to 12. This embodiment is a variation of Embodiment 4 and is different from Embodiment 4 in that a silicide formed over an N-type region and a P-type region before forming a diffusion barrier region is NiSi.

Figure 10:
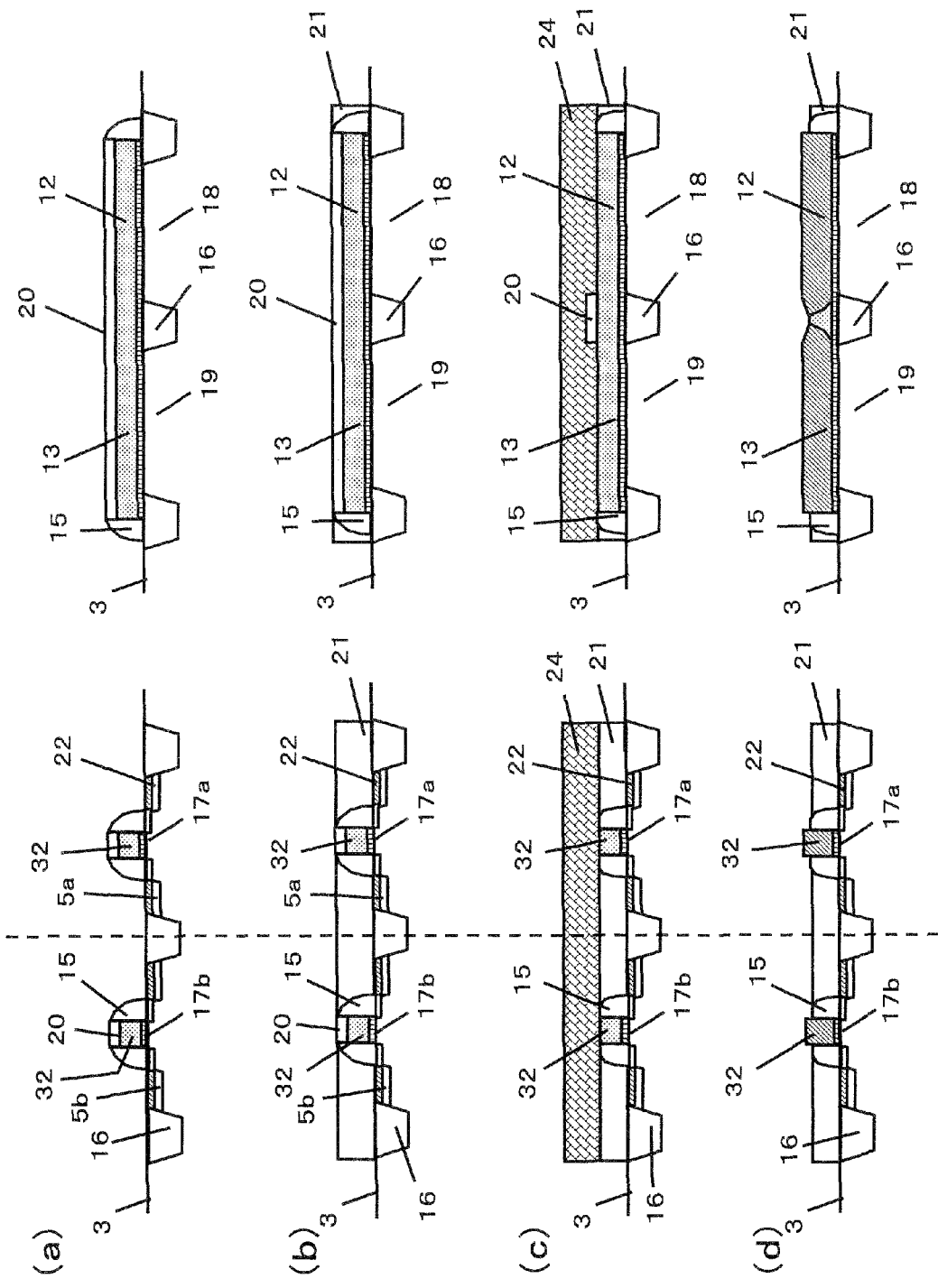
FIG. 10 shows Embodiment 3 of the manufacturing process according to the present invention.

In this embodiment, first, an N-type region, a P-type region, a polysilicon layer, a gate insulating film, a hard mask, a gate sidewall and source/drain regions are formed as described in Embodiment 4, and then a NiSi layer 22 is formed over the source/drain regions (FIG. 10(*a*)). Next, after depositing an interlayer insulating film 21, the hard mask is exposed by CMP (FIG. 10(*b*)). Then, the hard mask except the section over the isolation region is selectively etched back to expose the polysilicon regions (the gate pattern section) 12 and 13 over the N-type region and the P-type region, and then a Ni layer (a metal M3 layer) 24 is deposited (FIG. 10(*c*)).

Then, the whole polysilicon over the N-type region and the P-type region is reacted with Ni at 400° C. to form NiSi (a third siliciding step). In this state, the polysilicon under the hard mask does not react with nickel. Then, the Ni unreacted in the above siliciding reaction is removed and the hard mask on the isolation region is removed (FIG. 10(*d*)).

Figure 11:
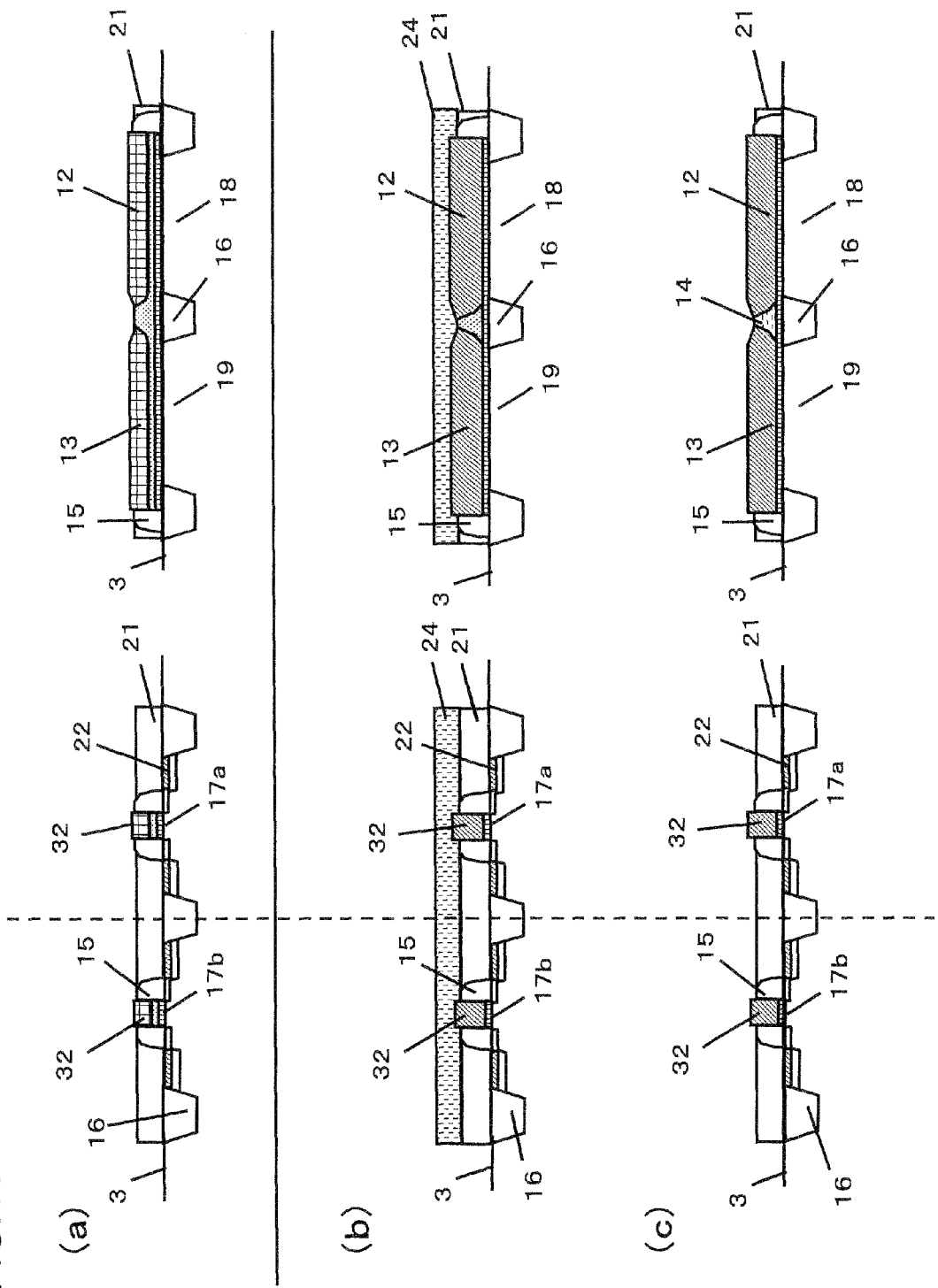
FIG. 11 shows Embodiment 3 of the manufacturing process according to the present invention.

As described in Embodiment 1, conversion of this polysilicon into NiSi may be conducted by two steps of partially converting the upper part of the polysilicon into Ni$_2$Si and then reacting the Ni$_2$Si with the unreacted lower polysilicon (FIG. 11(*a*)), where the whole polysilicons 12 and 13 over the N-type region and the P-type region must be converted into NiSi before forming the diffusion barrier region.

Next, a Pt layer (metal M4 layer) 24 is deposited over the whole surface (FIG. 11(*b*)), and the Pt is reacted with the unreacted polysilicon over the isolation region at 300° C. to form a diffusion barrier region 14 made of PtSi (a fourth siliciding step). Here, the gate patterns 12 and 13 over the N-type region and the P-type region does not react with Pt.

Figure 12:
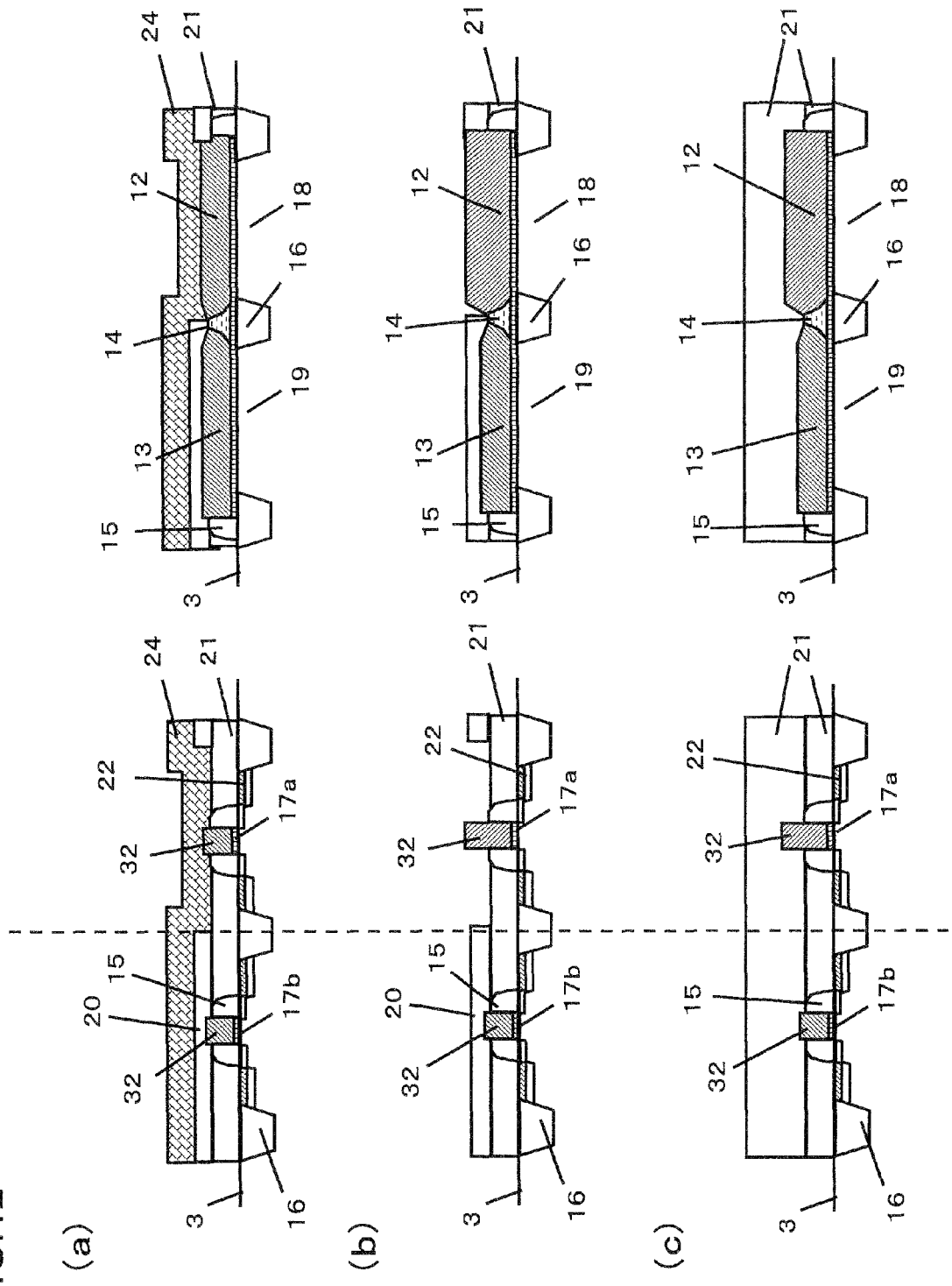
FIG. 12 shows Embodiment 3 of the manufacturing process according to the present invention.

Then, after removing the Pt layer 24 unreacted with the polysilicon in the above siliciding reaction by wet etching (FIG. 11(*c*)), as described in Embodiment 4, a mask 20 is formed on the gate pattern section 13 over the P-type region and then a Ni layer 24 is deposited (FIG. 12(*a*)). Furthermore, the Ni is reacted with the NiSi region 12 over the N-type region to form Ni$_3$Si (a fifth siliciding step). Then, after removing the Ni layer 24 unreacted with the NiSi over the N-type region (FIG. 12(*b*)), the mask 20 formed on the gate pattern 13 over the P-type region is removed and then an interlayer insulating film 21 is formed to provide a semiconductor device of the present invention (FIG. 12(*c*)).

In this embodiment, in the initial siliciding step (NiSi formation) before forming the diffusion barrier region, the gate pattern section over the P-type region becomes a NiSi crystal phase, and the electrode section (B) (the second gate electrode) is formed. In the second siliciding step (formation of the Ni$_3$Si crystal phase from the NiSi crystal phase) after forming the diffusion barrier region, the gate pattern section over the N-type region becomes a $Ni_3Si$ crystal phase and the electrode section (A) (the first gate electrode) is formed. In this embodiment, the constituent element A' and B' materials and the diffusion coefficients $D_1$ to $D_4$ are as described for Embodiment 1.

Here, the diffusion barrier region has been already formed and thus mutual diffusion between the materials constituting the gate pattern sections separated by the diffusion barrier region is prevented by the diffusion barrier region. Furthermore, since the material constituting the diffusion barrier region has a very small diffusion coefficient in the diffusion barrier region, it does not diffuse into the electrode sections (A) and (B). Therefore, the initially formed electrode section (B) and the secondly formed electrode section (A) have an uniform composition, and thus there can be provided a semiconductor device in which deviation in a work function is avoided, a $V_{th}$ is effectively controlled and which has excellent operation properties.

EMBODIMENT 6

Figure 15:
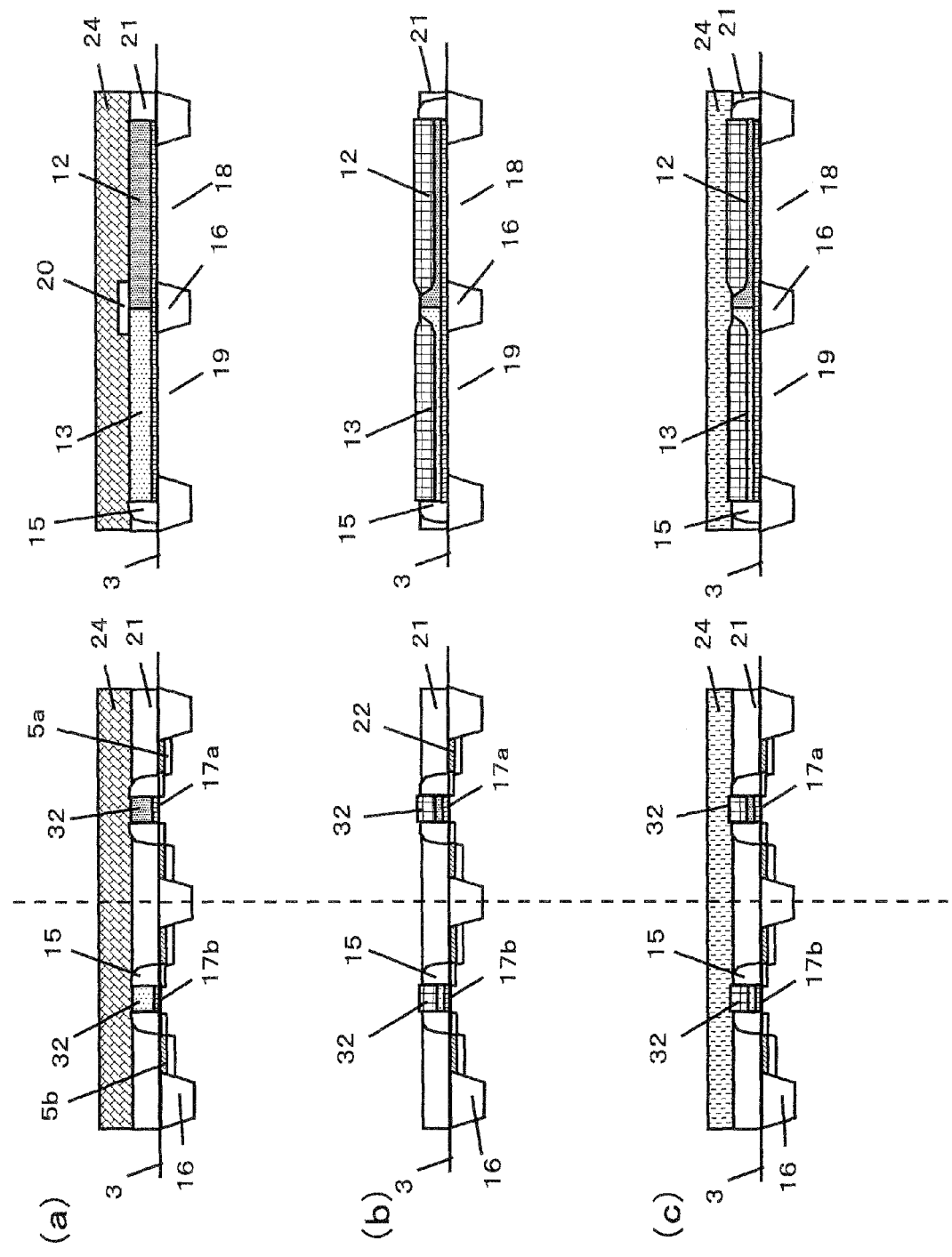
FIG. 15 shows Embodiment 5 of the manufacturing process according to the present invention.

Embodiment 6 of the present invention will be described with reference to FIGS. 15 and 16. This embodiment is a variation of Embodiment 4 and is different from Embodiment 4 in that a silicide preformed as a gate pattern contains different types (element) of dopants over an N-type region and a P-type region and that a gate insulating film is made of SiON. In this embodiment, there is formed a gate pattern made of polysilicon where the polysilicon over the P-type region contains As in $4 \times 10^{-15}$ $cm^{-2}$ while the polysilicon over the N-type region contains B in $4 \times 10^{-15}$ $cm^{-2}$. As described in Embodiment 4 for the other aspects, an N-type region, a P-type region, a polysilicon layer, a gate insulating film, a hard mask, a gate sidewall and source/drain regions are formed, and then a NiSi layer 22 is formed over the source/drain regions. Then, an interlayer insulating film 21 is formed and is flattened by CMP to expose the hard mask 20. Then, after removing the mask 20 on the gate pattern sections 12 and 13 over the N-type region and the P-type region to expose the polysilicon region (the gate pattern), a Ni layer (metal M3 layer) 24 is deposited (FIG. 15(a)).

Subsequently, as described in Embodiment 4, the upper parts of the polysilicons 12 and 13 over the N-type region and the P-type region are reacted with Ni (a third siliciding step) while leaving the unreacted polysilicon in the lower parts of the gate pattern sections over the N-type region and the P-type region. Then, the Ni unreacted in the above siliciding reaction is removed and the hard mask 20 over the isolation region is removed (FIG. 15(b)).

Next, after depositing a Pt layer (metal M4 layer) 23 over the whole surface (FIG. 15(c)), the Pt is reacted with the polysilicon over the isolation region to form a diffusion barrier region 14 made of PtSi (FIG. 16(a); a fourth siliciding step). Here, of the sections of the gate pattern over the N-type region and the P-type region, the preliminarily silicided section does not react with Pt. Then, the unreacted Pt is removed by wet etching, then the $Ni_2Si$ over the N-type region and the P-type region are reacted with the remaining polysilicon under them at 400° C. to form NiSi (a fifth siliciding step), and further an interlayer insulating film is formed to provide a semiconductor device of the present invention (FIG. 16(b)).

In this embodiment, in the initial siliciding step (NiSi formation) after forming the diffusion barrier region, the electrode sections (A) and (B) (the first gate electrode and the second gate electrode) made of a NiSi crystal phase containing a different dopant are formed in the sides of the diffusion barrier region. In this embodiment, the constituent elements A' and B', the electrode section (A) and (B) materials, and the diffusion coefficients $D_1$ to $D_4$ are as described for Embodiment 4. In this embodiment, since the diffusion barrier region is preliminarily formed over the isolation region, a dopant does not diffuse from one region to the other region. Furthermore, since the material constituting the diffusion barrier region has a very small diffusion coefficient in the diffusion barrier region, it does not diffuse into the electrode sections (A) and (B). Thus, the electrode sections (A) and (B) have an uniform composition, resulting in avoiding deviation in a work function. As a result, there can be provided a semiconductor device in which a $V_{th}$ is effectively controlled and which has excellent operation properties.

EMBODIMENT 7

Figure 20:
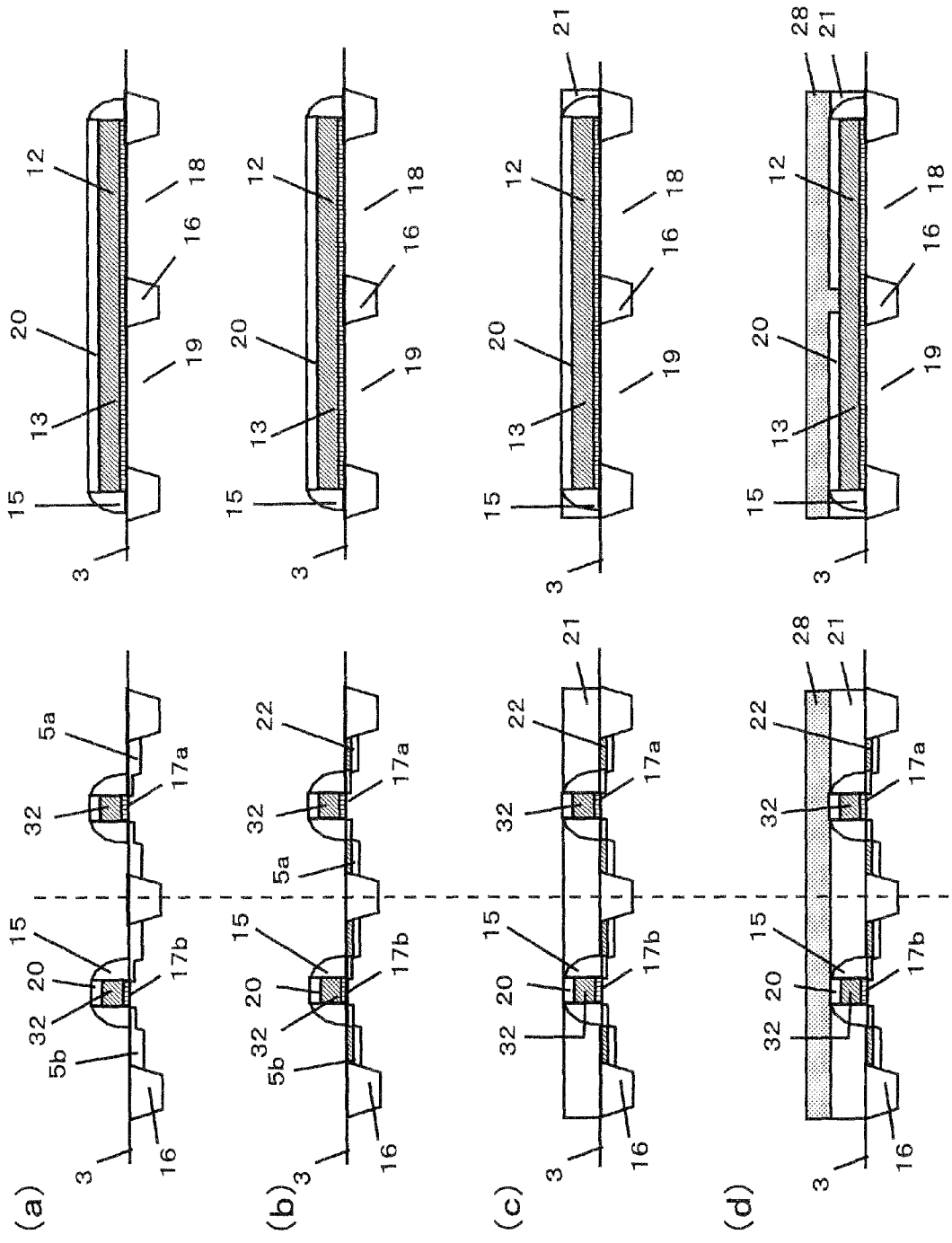
FIG. 20 shows Embodiment 7 of the manufacturing process according to the present invention.
Figure 21:
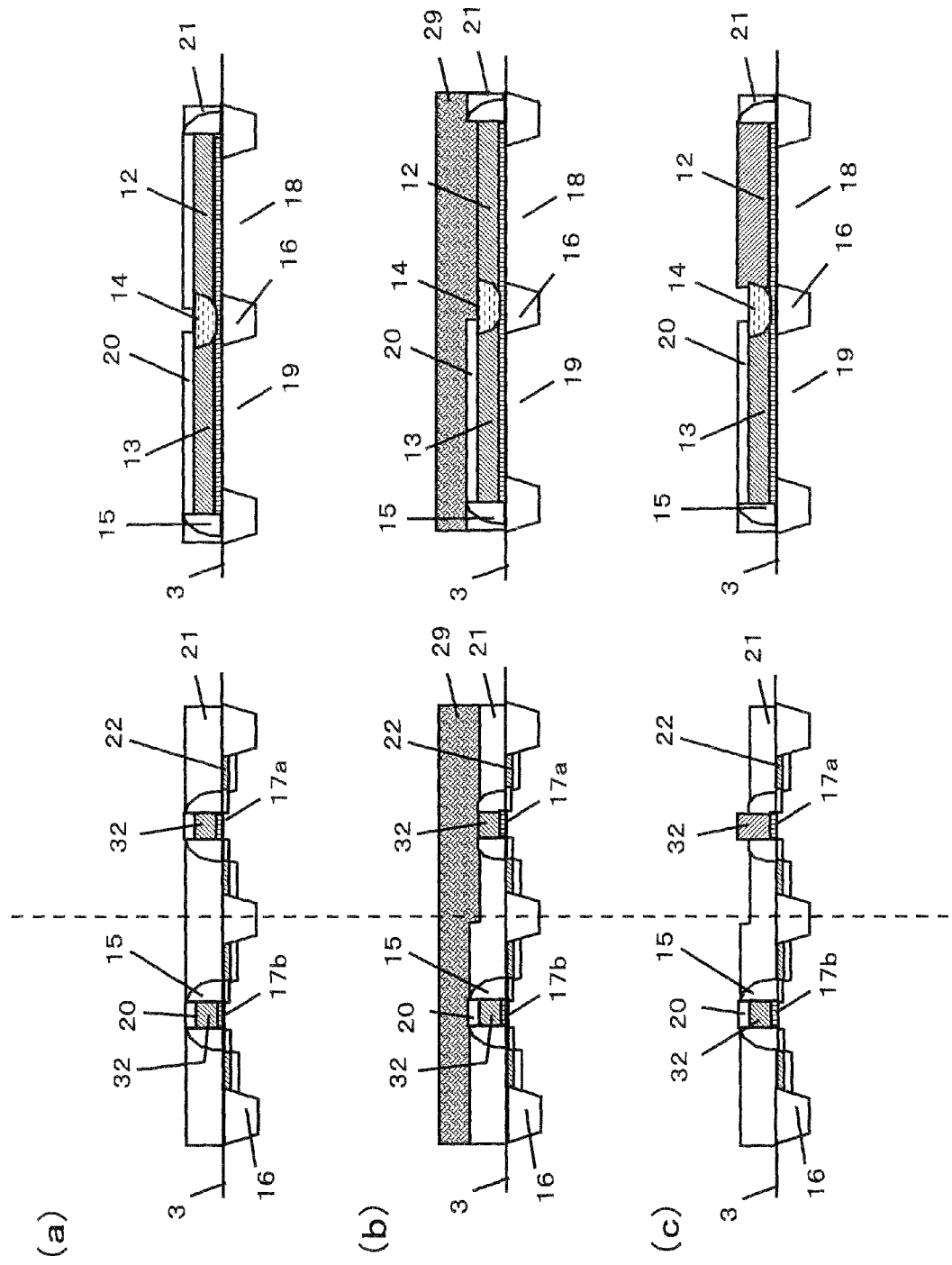
FIG. 21 shows Embodiment 7 of the manufacturing process according to the present invention.

Embodiment 7 of the present invention will be described with reference to FIGS. 20 and 21. This embodiment is a different type of embodiment from Embodiment 1 and 4, and different from these embodiments in that a gate insulating film, a gate electrode formed over an N-type region, a gate electrode formed over a P-type region and a diffusion barrier region are made of SiON, RuTa, Ru and $RuSi_x$ (ruthenium silicide), respectively.

In this embodiment, as described in Embodiment 1, an N-type region, a P-type region and a gate insulating film are formed and then a Ru layer is deposited to thickness 60 nm. Then, the Ru layer is dry etched under an atmosphere of $Ar/O_2$ to form a gate pattern 32 made of a Ru region extending from the region over the N-type region through the region over the isolation region to the region over the P-type region. Then, as described in Embodiment 1, a hard mask, a gate sidewall and source/drain regions are formed (FIG. 20(a)). Next, a $CoSi_2$ layer 22 is formed over the source/drain regions by salicide technology (FIG. 20(b)). Then, after forming the interlayer insulating film 21, it is flattened by CMP to expose the hard mask 20 (FIG. 20(c)).

Then, after partly removing the hard mask over the isolation region, a Si film is deposited over the whole surface (FIG. 20(d)). This Si layer may be a polysilicon film or an amorphous layer. The Si layer may be deposited by sputtering.

Subsequently, the polysilicon is reacted with Ru to form a diffusion barrier region 14 made of Ru silicide ($RuSi_x$) (FIG. 21(a); a seventh siliciding step). Here, since silicon is a diffusing species to Ru, silicon diffuses into the gate pattern made of Ru, initiating a siliciding reaction. The siliciding reaction of Ru is preferably conducted at 350 to 450° C. The siliciding of Ru is conducted at such a high temperature, but in this embodiment, $CoSi_2$ is also formed over the source/drain regions, so that the silicide over the source/drain regions is not deteriorated during forming the diffusion barrier region.

This reaction is continued until the Ru silicide substantially reaches the gate insulating film over the isolation region and terminated before the Ru silicide is formed within the gate pattern sections 12 and 13 over the N-type region and the P-type region. Thus, for controlling a region where a diffusion barrier region is formed within a gate pattern, a reaction time and a reaction temperature may be adjusted.

Then, after removing the Si layer unreacted with Ru, the mask 20 formed on the polysilicon 12 in the N-type region is removed by etching back. Then, a Ta layer 29 is deposited to thickness 60 nm over the whole surface by sputtering (FIG. 21(b)). This Ta layer 29 is deposited in an adequate amount to completely convert Ru over the N-type region into RuTa.

Then, the Ru is reacted with the Ta, to completely convert the Ru over the N-type region into RuTa (FIG. 21(c)). This siliciding reaction is typically conducted at 600° C., but may be preferably conducted at 550 to 750° C. Next, after removing the unreacted Ta layer 29 (FIG. 21(c)), the mask 20 formed over the P-type region is removed and then an interlayer insulating film is formed to provide a semiconductor device of the present invention.

In this embodiment, the Ru initially formed before forming the diffusion barrier region is the electrode section (B) (the second gate electrode) and in the reaction of Ru (RuTa formation) after forming the diffusion barrier region, the electrode section (A) (the first gate electrode) is formed. In the reaction of the Ru, the gate pattern (Ru) over the P-type region is separated from the gate pattern over the N-type region through the diffusion barrier region and the mask. In this embodiment, the constituent elements A' and B' are Ru and Ta, respectively and the electrode sections (A) and (B) materials are Ru and Ta, respectively. Therefore, $D_1$ is a diffusion coefficient of Ru, Ta in $RuSi_x$. $D_2$ is a diffusion coefficient of Ta in Ru and Ru in Ta. In this embodiment, since the electrode section (B) is made of a single material, $D_3$ or $D_4$ is not available. Under the process conditions of this embodiment, any of Ru and Ta meets the condition of $D_1 < D_2$.

Mutual diffusion between the materials constituting the gate pattern sections separated by the diffusion barrier region is prevented by the diffusion barrier region. Furthermore, since the material constituting the diffusion barrier region has a very small diffusion coefficient in the diffusion barrier region, it does not diffuse into the electrode section (A) and (B). Thus, the electrode sections (A) and (B) have an uniform composition, resulting in avoiding deviation in a work function. As a result, there can be provided a semiconductor device in which a $V_{th}$ is effectively controlled and which has excellent operation properties.

The invention claimed is:

1. A semiconductor device, comprising:
   an isolation region formed within a semiconductor substrate;
   an N-type region and a P-type region formed within the semiconductor substrate such that the N-type region and the P-type region are isolated by the isolation region;
   a line electrode extending from a region over the N-type region through a region over the isolation region to a region over the P-type region;
   a PMOS transistor comprising a first gate insulating film formed over the N-type region and a first gate electrode which is the line electrode over the N-type region; and
   an NMOS transistor comprising a second gate insulating film formed over the P-type region and a second gate electrode which is the line electrode over the P-type region,
   wherein the line electrode comprises an electrode section (A) comprising the first gate electrode, an electrode section (B) comprising the second gate electrode and a diffusion barrier region formed for preventing contact of the electrode sections (A) and (B) over the isolation region,
   wherein the diffusion barrier region contains an element different from elements in the electrode sections (A) and (B), and the electrode sections (A) and (B) are made of materials containing mutually different elements or of materials containing the same elements in a different composition,
   wherein the diffusion barrier region meets the following conditions (1) and (2):
   (1) a diffusion coefficient $D_1$ of a constituent element A' of the electrode section (A) in the diffusion barrier region is lower than an interdiffusion coefficient $D_2$ of the constituent element A' between the electrode section (A) materials;
   (2) a diffusion coefficient $D_3$ of a constituent element B' of the electrode section (B) in the diffusion barrier region is lower than an interdiffusion coefficient $D_4$ of the constituent element B' between the electrode section (B) materials,
   wherein the electrode sections (A) and (B) as well as the diffusion barrier region are made of a silicide, and
   wherein the silicide constituting the diffusion barrier region is a silicide containing a metal element which becomes a diffusing species to silicon during a siliciding reaction.

2. The semiconductor device as claimed in claim 1,
   wherein the silicide constituting the diffusion barrier region is a silicide of at least one metal element selected from the group consisting of Pt, Pd, Co and Ni.

3. The semiconductor device as claimed in claim 1,
   wherein the electrode section (A) is made of a silicide represented by $Ni_xSi_{1-x}$ ($0.55 \leq x < 1$), and the electrode section (B) is made of a silicide represented by $Ni_xSi_{1-x}$ ($0 < x < 0.55$).

4. The semiconductor device as claimed in claim 3,
   wherein the electrode section (A) is made of $Ni_3Si$ or $Ni_2Si$, and the electrode section (B) is made of NiSi or $NiSi_2$.

5. The semiconductor device as claimed in claim 1,
   wherein the silicides constituting the electrode sections (A) and (B) are dopant-containing silicides which contain dopants consisting of mutually different elements.

6. The semiconductor device as claimed in claim 5,
   wherein the electrode section (A) is made of NiSi containing B, Al or In as the dopant, and the electrode section (B) is made of NiSi containing P, As or Sb as the dopant.

7. The semiconductor device as claimed in claim 1,
   wherein the silicides constituting the electrode sections (A) and (B) are a refractory metal silicide.

8. A semiconductor device, comprising:
   an isolation region formed within a semiconductor substrate;
   an N-type region and a P-type region formed within the semiconductor substrate such that the N-type region and the P-type region are isolated by the isolation region;
   a line electrode extending from a region over the N-type region through a region over the isolation region to a region over the P-type region;
   a PMOS transistor comprising a first gate insulating film formed over the N-type region and a first gate electrode which is the line electrode over the N-type region; and
   an NMOS transistor comprising a second gate insulating film formed over the P-type region and a second gate electrode which is the line electrode over the P-type region,
   wherein the line electrode comprises an electrode section (A) comprising the first gate electrode, an electrode section (B) comprising the second gate electrode and a diffusion barrier region formed for preventing contact of the electrode sections (A) and (B) over the isolation region,
   wherein the diffusion barrier region contains an element different from elements in the electrode sections (A) and (B), and the electrode sections (A) and (B) are made of materials containing mutually different elements or of materials containing the same elements in a different composition, wherein the diffusion barrier region meets at least one of the following conditions (1) and (2):

(1) a diffusion coefficient D1 of a constituent element A' of the electrode section (A) in the diffusion barrier region is lower than an interdiffusion coefficient D2 of the constituent element A' between the electrode section (A) materials;

(2) a diffusion coefficient D3 of a constituent element B' of the electrode section (B) in the diffusion barrier region is lower than an interdiffusion coefficient D4 of the constituent element B' between the electrode section (B) materials, and wherein the electrode sections (A) and (B) as well as the diffusion barrier region contain the same metal element M1, and wherein the diffusion barrier region is made of a silicide of the metal element M1, and the metal element M1 is such an element that in a siliciding reaction of the metal element M1, silicon is a diffusing species to the metal element M1, wherein the diffusion barrier region meets only the condition (1), the metal element M1 is Ru, and the electrode section (A) and the electrode section (B) are made of RuTa and Ru, respectively.

9. The semiconductor device as claimed in claim 1, wherein the first and the second gate insulating films are a high-dielectric insulating film.

10. The semiconductor device as claimed in claim 1, wherein the NMOS transistor and the PMOS transistor constitute a CMOS transistor.

11. A process for manufacturing the semiconductor device as claimed in claim 1, comprising:
preparing the semiconductor substrate comprising the N-type region and the P-type region which are isolated by the isolation region;
forming a gate insulating film on the semiconductor substrate;
forming a polysilicon gate pattern extending from a region over the N-type region through a region over the isolation region to a region over the P-type region;
forming a mask over the gate pattern;
removing a part of the mask formed on the gate pattern over the isolation region to expose the polysilicon;
depositing a layer of a silicide-formable metal M2 on the exposed polysilicon;
reacting the metal M2 and the polysilicon by heating to form the diffusion barrier region such that a silicide of the metal M2 is formed until it comes into contact with the gate insulating film over the isolation region and the silicide of the metal M2 is absent over the N-type region and the P-type region, as a first siliciding step;
removing the layer of the metal M2 which is unreacted with the polysilicon during the first siliciding step; and
converting gate pattern sections over the N-type region and over the P-type region which are separated by the diffusion barrier region into the electrode sections (A) and (B) made of a silicide, respectively, as a second siliciding step.

12. The process for manufacturing the semiconductor device as claimed in claim 11,
wherein the metal M2 is Pt, and
the second siliciding step comprises:
removing the mask remaining on the gate pattern sections over the N-type and P-type regions;
depositing an Ni layer on the gate patterns;
reacting the polysilicon constituting the gate pattern sections over the N-type and the P-type regions with the Ni by heating to form NiSi regions;
removing the Ni layer unreacted with the polysilicon;
forming a mask on the NiSi region over the P-type region;
depositing an Ni layer on the NiSi region over the N-type region;
reacting the NiSi constituting the NiSi region over the N-type region with the Ni by heating to form $Ni_3Si$;
removing the Ni layer unreacted with the NiSi; and
removing the mask formed on the NiSi region over the P-type region.

13. The process for manufacturing the semiconductor device as claimed in claim 11,
wherein in forming the gate pattern, dopant-containing polysilicons are formed such that the dopant-containing polysilicons over the N-type and the P-type regions contain dopants consisting of different elements, as the polysilicon,
the metal M2 is Pt, and
the second siliciding step comprises:
removing the mask remaining on the gate pattern sections over the N-type and P-type regions;
depositing an Ni layer on the gate patterns;
reacting dopant-containing polysilicons constituting the gate pattern sections over the N-type and the P-type regions with the Ni by heating, respectively, to form dopant-containing NiSi regions; and
removing the Ni layer unreacted with the dopant-containing polysilicon.

14. The process for manufacturing the semiconductor device as claimed in claim 11,
wherein the metal M2 is Co, and
the second siliciding step comprises:
removing the mask formed on the gate pattern section over the N-type region;
depositing an Mo layer on the gate pattern section over the N-type region;
reacting the Mo with the polysilicon constituting the gate pattern section over the N-type region by heating to form $MoSi_2$;
removing the Mo layer unreacted with the polysilicon;
removing the mask formed on the gate pattern section over the P-type region;
depositing a Hf layer on the gate pattern section over the P-type region;
reacting the Hf with the polysilicon constituting the gate pattern section over the P-type region by heating to form HfSi; and
removing the Hf layer unreacted with the polysilicon.

15. A process for manufacturing the semiconductor device as claimed in claim 1, comprising:
preparing the semiconductor substrate comprising the N-type region and the P-type region which are isolated by the isolation region;
forming a gate insulating film on the semiconductor substrate;
forming a polysilicon gate pattern extending from a region over the N-type region through a region over the isolation region to a region over the P-type region;
forming a mask over the gate pattern;
removing the mask formed on gate pattern sections over the N-type and the P-type regions to expose the polysilicon;
depositing a layer of a silicide-formable metal M3 on the exposed polysilicon;

reacting the metal M3 with the exposed polysilicon by heating to converting at least part of the gate pattern sections over the N-type and the P-type regions into metal M3 silicide regions such that the gate pattern sections of the N-type and the P-type regions are not mutually communicated over the isolation region, as a third siliciding step;

removing the layer of the metal M3 unreacted with the polysilicon during the third siliciding step;

removing the mask remaining on the gate pattern over the isolation region to expose the polysilicon;

depositing a layer of a silicide-formable metal M4 on the exposed polysilicon;

reacting the metal M4 with the exposed polysilicon by heating to form the diffusion barrier region such that a silicide of the metal M4 is formed until it comes into contact with the gate insulating film over the isolation region and the silicide of the metal M4 is absent over the N-type region and the P-type region, as a fourth siliciding step;

removing the layer of the metal M4 unreacted with the polysilicon during the fourth siliciding step; and converting the metal M3 silicide regions over the N-type and the P-type regions into the electrode sections (A) and (B), respectively, as a fifth siliciding step.

16. The process for manufacturing the semiconductor device as claimed in claim 15, wherein the third siliciding step is reacting the metal M3 with the upper part of the polysilicon to form an $Ni_2Si$ region and to leave the unreacted polysilicon in the lower part of the $Ni_2Si$ region, the metal M4 is Pt, and the fifth siliciding step comprises:

reacting the $Ni_2Si$ constituting the $Ni_2Si$ region with the polysilicon remaining in the lower part of the $Ni_2Si$ region by heating to form an NiSi region;

forming a mask on the NiSi region over the P-type region;

depositing an Ni layer on the NiSi region over the N-type region;

reacting the NiSi constituting the NiSi region over the N-type region with the Ni by heating to form $Ni_2Si$;

removing the Ni layer unreacted with the NiSi; and removing the mask formed on the NiSi region over the P-type region.

17. The process for manufacturing the semiconductor device as claimed in claim 15, wherein the third siliciding step is reacting the metal M3 with all the polysilicon constituting the gate pattern sections over the N-type and the P-type regions to form an NiSi region, the metal M4 is Pt, and the fifth siliciding step comprises:

forming a mask on the NiSi region over the P-type region;

depositing an Ni layer on the NiSi region over the N-type region;

reacting the NiSi constituting the NiSi region over the N-type region with the Ni by heating to form $Ni_3Si$;

removing the Ni layer unreacted with the NiSi; and removing the mask formed on the NiSi region over the P-type region.

18. The process for manufacturing the semiconductor device as claimed in claim 15, wherein in forming the gate pattern, dopant-containing polysilicons are formed such that dopant-containing polysilicons over the N-type and the P-type regions contain dopants of different elements, as the polysilicon, the third siliciding step is reacting the metal M3 with the upper part of the dopant-containing polysilicon to form a dopant-containing $Ni_2Si$ region and to leave the unreacted dopant-containing polysilicon in the lower part of the dopant-containing $Ni_2Si$ region, the metal M4 is Pt, and the fifth siliciding step comprises the step of reacting the dopant-containing $Ni_2Si$ constituting the dopant-containing $Ni_2Si$ region with the dopant-containing polysilicon remaining in the lower part of the dopant-containing $Ni_2Si$ region by heating to form a dopant-containing NiSi.

19. A process for manufacturing the semiconductor device as claimed in claim 1, comprising:

preparing the semiconductor substrate comprising the N-type region and the P-type region which are isolated by the isolation region;

forming a gate insulating film on the semiconductor substrate;

forming a gate pattern made of Ru extending from a region over the N-type region through a region over the isolation region to a region over the P-type region;

forming a mask over the gate pattern;

removing a part of the mask formed on the gate pattern over the isolation region to expose the Ru;

depositing a silicon layer on the exposed Ru;

reacting the Ru with the silicon by heating to form the diffusion barrier region such that a silicide of the Ru is formed until it comes into contact with the gate insulating film over the isolation region and the silicide of Ru is absent over the N-type region and the P-type region, as a sixth siliciding step;

removing the silicon layer unreacted with the Ru in the sixth siliciding step;

removing the mask remaining on the gate pattern section over the N-type region;

depositing a Ta layer on the gate pattern section over the N-type region;

reacting the Ru constituting the gate pattern section over the N-type region with the Ta by heating to form RuTa;

removing the Ta layer unreacted with the Ru; and removing the mask remaining on the gate pattern section over the P-type region.

* * * * *